US012580569B2

(12) United States Patent
Ding et al.

(10) Patent No.: US 12,580,569 B2
(45) Date of Patent: *Mar. 17, 2026

(54) MULTI-BIT LEVEL SHIFTER

(71) Applicants: TAIWAN SEMICONDUCTOR MANUFACTURING COMPANY, LTD., Hsinchu (TW); TSMC NANJING COMPANY, LIMITED, Nanjing (CN)

(72) Inventors: Jing Ding, Hsinchu (TW); Zhang-Ying Yan, Hsinchu (TW); Qingchao Meng, Hsinchu (TW); Yi-Ting Chen, Hsinchu (TW)

(73) Assignees: TAIWAN SEMICONDUCTOR MANUFACTURING COMPANY, LTD., Hsinchu (TW); TSMC NANJING COMPANY, LIMITED, Nanjing (CN)

( * ) Notice: Subject to any disclaimer, the term of this patent is extended or adjusted under 35 U.S.C. 154(b) by 148 days.

This patent is subject to a terminal disclaimer.

(21) Appl. No.: 18/479,378

(22) Filed: Oct. 2, 2023

(65) Prior Publication Data

US 2024/0030920 A1       Jan. 25, 2024

Related U.S. Application Data

(63) Continuation of application No. 17/885,365, filed on Aug. 10, 2022, now Pat. No. 11,777,501, which is a
(Continued)

(30) Foreign Application Priority Data

Jun. 2, 2021    (CN) .......................... 202110616093.0

(51) Int. Cl.
H03K 19/0185       (2006.01)
H03K 3/356          (2006.01)

(52) U.S. Cl.
CPC .............. *H03K 19/018521* (2013.01); *H03K 3/356113* (2013.01); *H03K 3/356182* (2013.01)

(58) Field of Classification Search
None
See application file for complete search history.

(56) References Cited

U.S. PATENT DOCUMENTS 6,940,762 B2    9/2005  Umezawa
7,205,820 B1    4/2007  Yeung et al.
(Continued)

FOREIGN PATENT DOCUMENTS

CN        102820880       12/2012
JP        2020014152       1/2020
(Continued)

OTHER PUBLICATIONS

Office Action dated Apr. 5, 2022 for corresponding case No. DE 10 2021 116 834.1. (p. 1).

*Primary Examiner* — Kenneth B Wells
(74) *Attorney, Agent, or Firm* — Hauptman Ham, LLP

(57)       ABSTRACT

A semiconductor device includes: first and second input circuits in a central region and correspondingly configured to operate in a first voltage domain; first and second single bit level shifters (SBLSs) correspondingly in first and second regions at first and second sides of the central region relative to a first direction and electrically coupled correspondingly to the first and second input circuits, and correspondingly configured to operate in a second voltage domain; and a control circuit configured to toggle each of the first and second SBLSs between a normal state and a standby state when a control signal is received from the control circuit.

20 Claims, 15 Drawing Sheets

Related U.S. Application Data continuation of application No. 17/348,013, filed on Jun. 15, 2021, now Pat. No. 11,456,744.

(56)                    References Cited

U.S. PATENT DOCUMENTS

| | | |
|---|---|---|
| 7,260,442 B2 | 8/2007 | Hwang et al. |
| 8,379,425 B2 * | 2/2013 | Fukuoka ................. H03K 3/00 |
| | | 713/300 |
| 9,256,709 B2 | 2/2016 | Yu et al. |
| 11,063,593 B2 | 7/2021 | Ramarajan |
| 11,073,857 B1 | 7/2021 | Liberti et al. |
| 11,456,744 B1 | 9/2022 | Ding et al. |
| 2004/0252558 A1 | 12/2004 | Umezawa |
| 2014/0040838 A1 | 2/2014 | Liu et al. |
| 2014/0084984 A1 | 3/2014 | Lin et al. |
| 2015/0278429 A1 | 10/2015 | Chang |
| 2017/0026044 A1 | 1/2017 | Bowles et al. |
| 2018/0006651 A1 | 1/2018 | Narayanan et al. |
| 2018/0062403 A1 | 3/2018 | Jeon |
| 2020/0019671 A1 | 1/2020 | Lin et al. |
| 2020/0134121 A1 | 4/2020 | Lin et al. |

FOREIGN PATENT DOCUMENTS

| | | |
|---|---|---|
| KR | 10-2015-0099380 | 8/2015 |
| KR | 10-2019-0003913 | 1/2019 |
| WO | WO0156159 | 8/2001 |

* cited by examiner

100

102
REGION THAT OPERATES IN FIRST
VOLTAGE DOMAIN

104
REGION THAT OPERATES IN SECOND
VOLTAGE DOMAIN

106
REGION THAT INCLUDES
ONE OR MORE CIRCUITS, SUCH AS
MBLS, TO LEVEL ADJUST DATA IN ONE
VOLTAGE DOMAIN TO ANOTHER
VOLTAGE
DOMAIN

Y-AXIS
(VERTICAL)

X-AXIS
(HORIZONTAL)

| Layout characteristics | Single bit | 2-bit | 4-bit | 8-bit | Relationship |
|---|---|---|---|---|---|
| Cell pitch | D1 | D2 | D3 | D4 | $1 \leq D2/D1 < 2$<br>$1 \leq D3/D2 < 2$<br>$D2 < D4 < D3$<br>$(\approx D1) \leq D2 < (\approx 2*D1)$ |
| Cell height | E1 | E2 | E3 | E4 | $E1 = E2 = E3 = 1/2*E4$ |
| NWEELL space/gap | A1 | A2 | A3 | A4 | $A1 = A2 = A3 = A4$ |
| VDD NWELL width | B1,B3 | B2,B4 | B5,B6 | B7,B8 | $B2+B4 < 2(B1+B3)$<br>$B5+B6 < 2(B2+B4)$<br>$B7 = B5$<br>$B8 = B6$ |
| VDDL NWELL width | C1 | C2 | C3 | C4 | $1 \leq C2/C1 < 2$<br>$1 \leq C3/C2 < 2$<br>$C4 < C3$<br>$(\approx C1) \leq C2 < (\approx 2*C1)$ |
| VDD NWELL heigth | Y1 | Y2 | Y3 | Y4 | $Y1 = Y2 = Y3 = Y4$ |
| VDDL NWELL heigth | H1 | H2 | H3 | H4 | $H1 <= 2E1 - 2A1 - Y1$<br>$H2 <= 2E2 - 2A2 - Y2$<br>$H3 <= 2E3 - 2A3 - Y3$<br>$H4 <= 2E4 - 2A4 - Y4$ |

FIG. 10

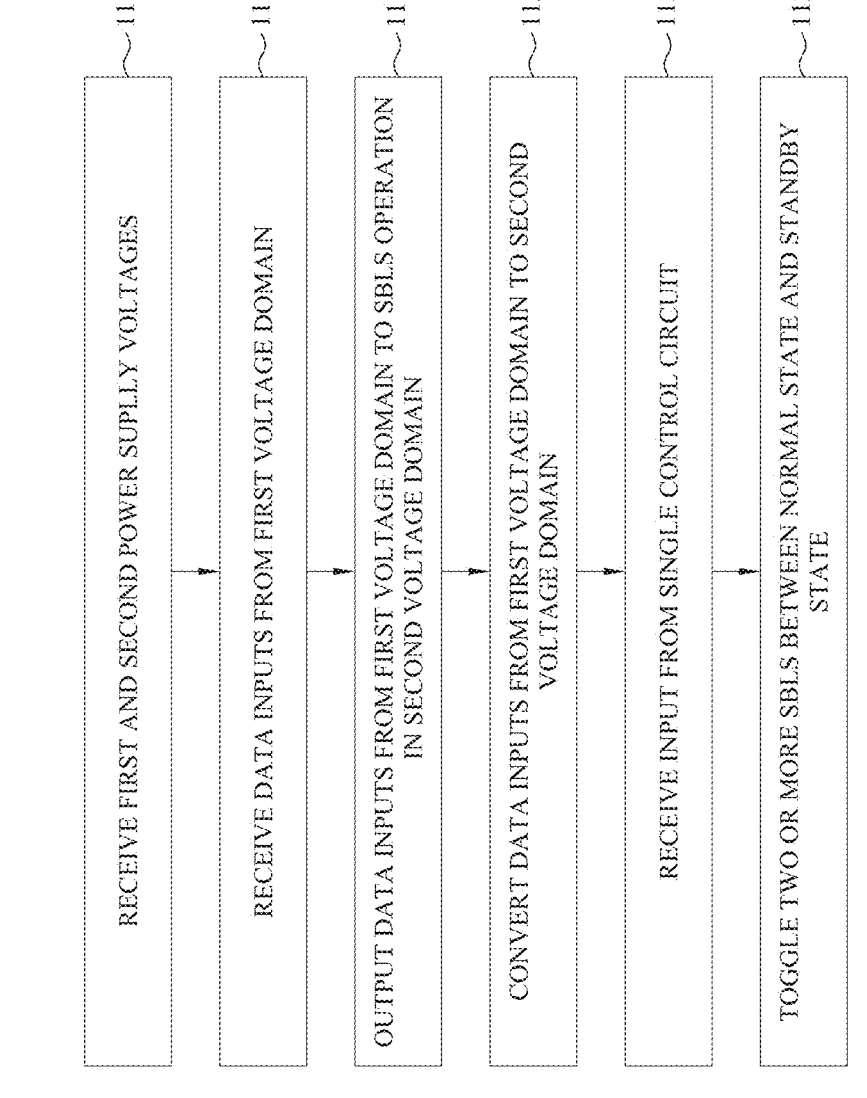

1100

1110 RECEIVE FIRST AND SECOND POWER SUPPLY VOLTAGES

1112 RECEIVE DATA INPUTS FROM FIRST VOLTAGE DOMAIN

1114 OUTPUT DATA INPUTS FROM FIRST VOLTAGE DOMAIN TO SBLS OPERATION IN SECOND VOLTAGE DOMAIN

1120 CONVERT DATA INPUTS FROM FIRST VOLTAGE DOMAIN TO SECOND VOLTAGE DOMAIN

1130 RECEIVE INPUT FROM SINGLE CONTROL CIRCUIT

1132 TOGGLE TWO OR MORE SBLS BETWEEN NORMAL STATE AND STANDBY STATE

1210 FABRICATE N-WELLS IN SUBSTRATE

1212 FABRICATE A FIRST TRANSISTOR OF A FIRST CONDUCTIVITY TYPE AT LEAST PARTIALLY IN N-WELLS

1214 FABRICATE A SECOND TRANSISTOR OF A SECOND CONDUCTIVITY TYPE AT LEAST PARTIALLY IN SUBSTRATE

1220 DEPOSIT AND PATTERN METAL LAYER

MULTI-BIT LEVEL SHIFTER

RELATED APPLICATIONS

The present application is a continuation of U.S. patent application Ser. No. 17/885,365, filed Aug. 10, 2022, now U.S. Pat. No. 11,777,501, issued Oct. 3, 2023, which is a continuation of U.S. patent application Ser. No. 17/348,013, filed Jun. 15, 2021, now U.S. Pat. No. 11,456,744, issued Sep. 27, 2022, which claims priority to China Patent Application No. 202110616093.0, filed Jun. 2, 2021, each of which is incorporated herein in entirety by reference.

BACKGROUND

Integrated circuits (ICs) sometimes include multiple portions corresponding to independently controlled power domains. In some cases, a first power domain includes a first power supply voltage level and a second power domain includes a second power supply voltage level different from the first power supply voltage level. Signals are propagated between such portions using level shifters that shift logical levels between the first and second power supply voltage levels.

A level shifter in digital electronics, also referred to as a logic-level shifter or voltage level translator, is a circuit used to translate signals from one logic level or voltage domain to another, facilitating compatibility between ICs with different voltage requirements, such as transistor-transistor logic (TTL) and complementary metal oxide semiconductor (CMOS). Level shifters are used to bridge domains between processors, logic, sensors, and other circuits.

BRIEF DESCRIPTION OF THE DRAWINGS

Aspects of the present disclosure are best understood from the following detailed description when read with the accompanying FIGS. In accordance with the standard practice in the industry, various features are not drawn to scale. In fact, the dimensions of the various features may be arbitrarily increased or reduced for clarity of discussion.

FIG. 10 is a table, in accordance with some embodiments.

FIG. 11 is a flowchart of a method of converting data between voltage domains, in accordance with some embodiments.

DETAILED DESCRIPTION

Figure 1:
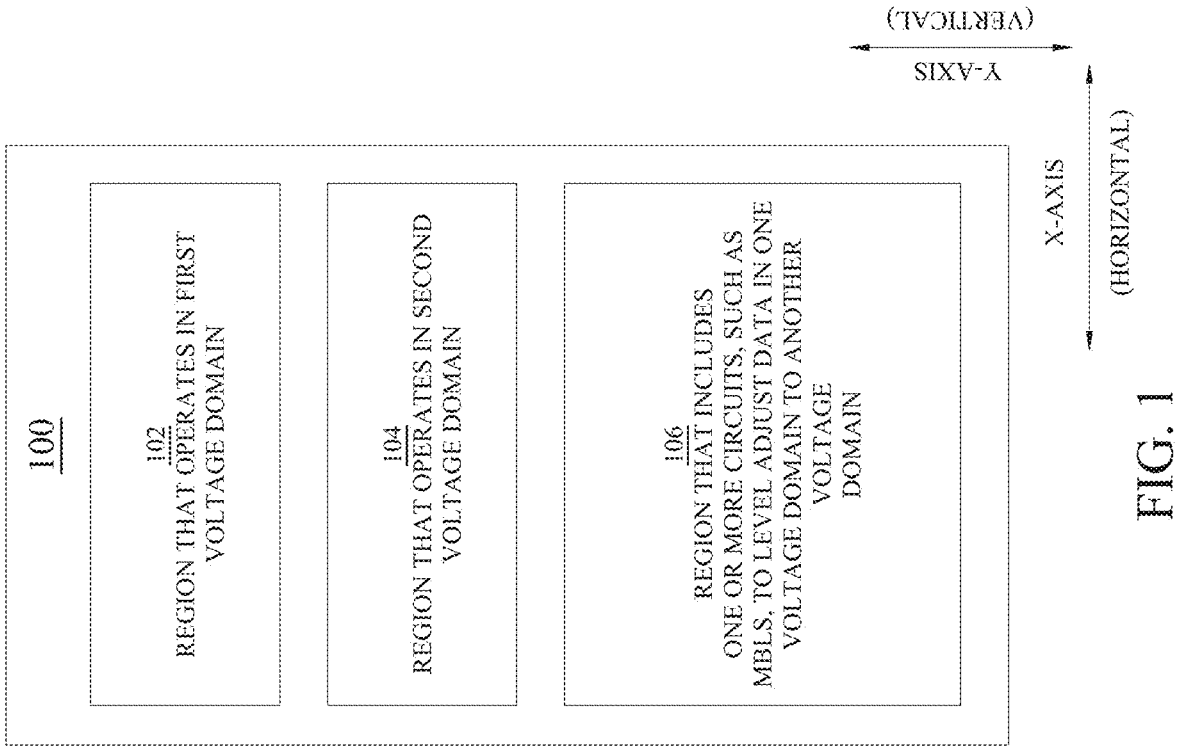
FIG. 1 is a block diagram of an integrated circuit (IC), in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the FIGS. The apparatus may be otherwise oriented (rotated 90 degrees or at other orientations) and the spatially relative descriptors used herein may likewise be interpreted accordingly.

In some embodiments, a multi-bit level-shifter (MBLS) is a circuit that includes multiple single-bit level shifters (SBLSs) (each of which is a corresponding circuit) and corresponding multiple input circuits, and wherein the multiple SBLSs share a common control circuit, each of the multiple SBLSs has a corresponding second voltage domain N-well (SNW), and the multiple input circuits share a first voltage domain N-well (FNW). In some embodiments, the MBLS is used as a voltage domain interface in a semiconductor device having multiple voltage domains, e.g., power supplies. In some embodiments, the MBLS is used for parallel data/address signal transfer. In some embodiments, a single control circuit is used to toggle the operation of the MBLS between operational states, e.g., a normal state and a standby state. As such, all SBLSs within the MBLS share a single control circuit. In some embodiments, the normal state is described as a responsive mode and the standby state is described as an unresponsive mode. In some embodiments, in the responsive mode, the single control circuit controls the MBLS to generate output signals having values which are correspondingly responsive to values of input signals to the MBLS. In some embodiments, in the unresponsive mode, the single control circuit controls the MBLS to generate output signals having static values, e.g., values of all of the output signals of the MBLS have a high logical level or all have a low logical level, regardless of values of the input signals to the MBLS such that the MBLS is unresponsive to changes in values of the input signals to the MBLS. In some of embodiments, one of the SBLSs has an SNW which is shared with the control circuit. According to another approach, multiple SBLSs and multiple control circuits are provided on a one-to-one (1:1) ratio, i.e., each SBLS has a corresponding control circuit. Furthermore, according to the other approach, each SBLS includes three NWs, namely a first NW for a SBLS, a second NW for an input circuit, and a third NW that is (in effect) a dummy NW. In contrast to the other approach, benefits of having a single control circuit for multiple SBLSs and/or having SBLSs share NWs is that power consumption and area usage are reduced in some embodiments. In some embodiments, a power savings of 17% or greater is realized for two SBLSs, as contrasted with the other approach. In some embodiments, an area savings of 39% or greater is realized by sharing one control circuit for two SBLSs, as contrasted with the other approach. In some embodiments, the power and area savings continue to be realized as the number of bits increases from 2-bits to 4-bits, to 8-bits, or to a greater number of bits, in the MBLS.

In some embodiments, each of the input circuits that receives data to be converted from one voltage domain to another voltage domain shares a FNW within the MBLS, and the SNWs are located around the centralized FNW. In some embodiments, the SNWs are arranged symmetrically about the FNW. In some embodiments, regarding SBLSs that output data that has been converted from one voltage domain to another voltage domain, the SBLSs share a SNW located around the centralized FNW. Additionally or alternatively, each additional SNW supports one or more SBLSs.

FIG. 1 is a block diagram of an integrated circuit (IC) 100, in accordance with some embodiments.

In FIG. 1, IC 100 includes a region 102 that operates in a first voltage domain, a region 104 that operates in a second voltage domain and a region 106 that includes one or more circuits, such as an MBLS (see FIG. 2), to level adjust data in one voltage domain to another voltage domain in some embodiments.

In some embodiments, IC 100 is also referred to as a chip or a microchip. Additionally or alternatively, IC 100 is a set of electronic circuits on one flat piece of semiconductor material that is normally silicon. IC 100 integrates a large number of tiny metal oxide semiconductor (MOS) transistors into a small chip resulting in circuits that are orders of magnitude smaller, faster, and less expensive than those constructed of discrete electronic components in some embodiments.

In some embodiments, IC 100 includes sets of electronic circuits (FIG. 2) correspondingly configured to operate in a region 102 including a first voltage domain. Additionally or alternatively, IC 100 also includes sets of electronic circuits (FIG. 2) configured to operate in a region 104 including a second voltage domain. The first voltage domain operates at a voltage either higher or lower than the second voltage domain in some embodiments. In some embodiments, the difference between the voltage domains is large or small. In some embodiments, electronic circuits (FIG. 2) include individual electronic components, such as resistors, transistors, capacitors, inductors and diodes, connected by conductive wires or traces through which electric current flows. Additionally or alternatively, the operation of a combination of components and wires performs various simple and/or complex operations, e.g., signals are amplified, computations are performed, logic operations are executed, data is moved from one place to another, or the like.

In some embodiments, region 106 is configured to convert data having levels which correspond to a first voltage domain to data having levels which correspond to a second voltage domain. Additionally or alternatively, region 106 includes one or more MBLS that include a single control circuit (see FIG. 2) configured to toggle operation of the MBLSs between a normal state (or mode) (discussed below) and a standby state (or mode) (discussed below). Additionally or alternatively, the control circuit selectively toggles transistors of each MBLS, cells of each MBLS or even entire circuits of each MBLS.

In some embodiments, the normal state is described as a responsive mode and the standby state is described as an unresponsive mode. In some embodiments, the normal state is described as a responsive mode because values of the output signals of the MBLS are correspondingly responsive to changes in values of the input signals to the MBLS. In some embodiments, the standby state is described as an unresponsive mode because values of the output signals of the MBLS are static, e.g., values of all of the output signals of the MBLS are at a high logical level or all are at a low logical level, and thus values of the output signals of the MBLS are correspondingly unresponsive to changes in values of the input signals to the MBLS. In some embodiments, the normal mode and unresponsive mode are correspondingly described as enabled and disabled modes. In some embodiments, the normal mode and unresponsive mode are correspondingly described as ON and OFF modes.

In some embodiments, sleep mode is a low power mode for electronic devices such as ICs, computers, and semiconductor devices. Additionally or alternatively, the low power mode saves significantly on electrical consumption compared to leaving a device fully powered. In some embodiments, regarding an IC, entering a sleep state is roughly equivalent to pausing the state of the IC at a given point. Additionally or alternatively, when restored, the operation continues from the given point. In some embodiments, regarding an IC, sleep mode is synonymous with standby and suspend. In some embodiments, the control circuit cuts power to the SBLS (i.e., the SBLS) and places the SBLS into a minimum power state.

In some embodiments, IC 100 includes a region 106 for coupling region 102 with region 104 or region 104 with region 102. Additionally or alternatively, region 106 includes two or more input circuits (see FIG. 2) correspondingly configured to operate in a first voltage domain. Each data input circuit handles a data signal that represents a single bit. Accordingly, because region 106 includes multiple data input circuits, region 106 is described as being a multi-bit (MB) portion of IC 100. Region 106 also includes two or more SBLSs (FIG. 2) electrically coupled correspondingly to the two or more input circuits, and correspondingly configured to operate in a second voltage domain in some embodiments. Additionally or alternatively, region 106 also includes a single control circuit (FIG. 2) for each SBLS configured to toggle. In some embodiments, region 106 includes one or more MBLS.

Figure 2:
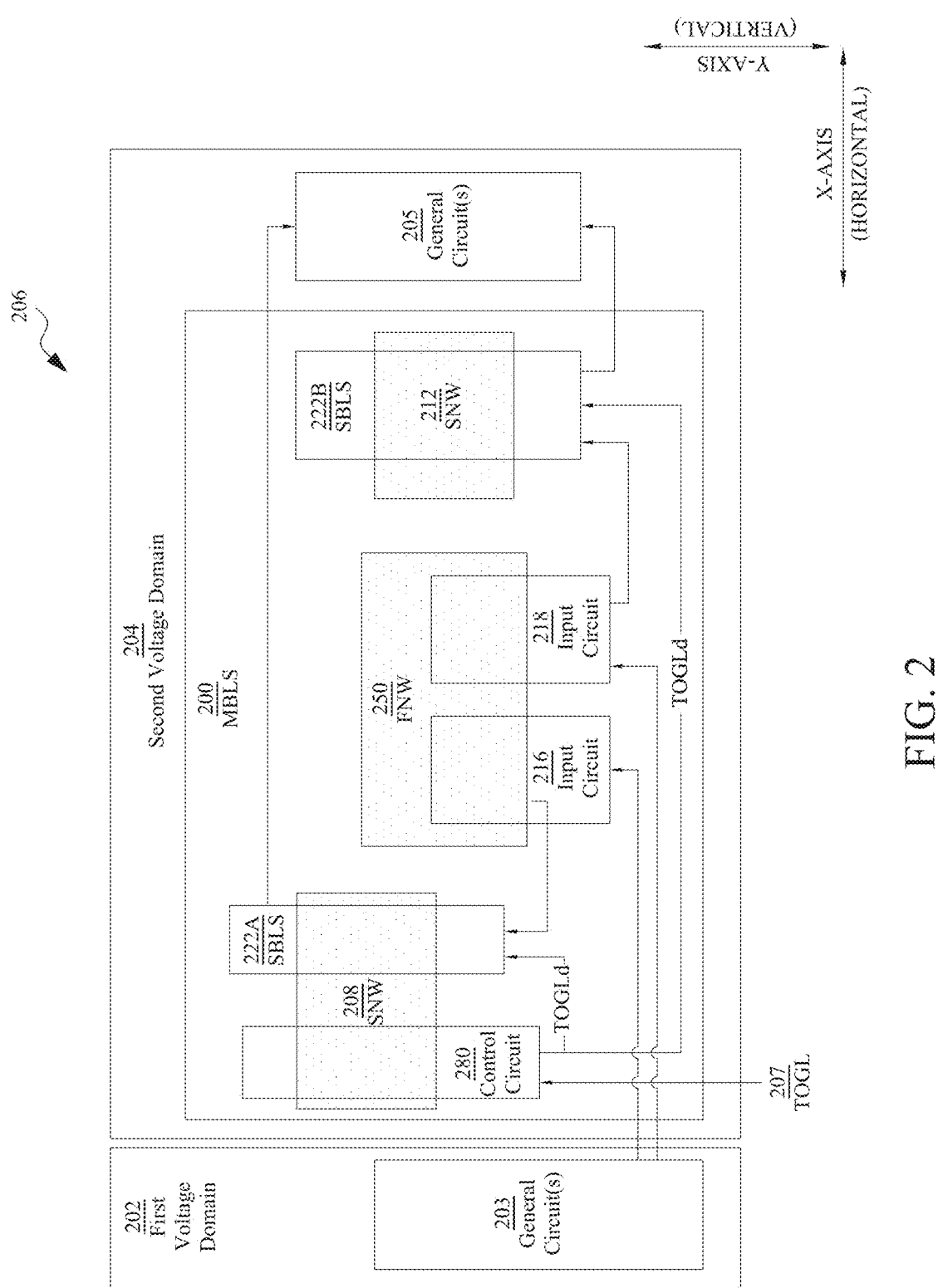
FIG. 2 is a block diagram of a region coupling two voltage domains, in accordance with some embodiments.

FIG. 2 is a block diagram of a region 206 coupling two voltage domains, in accordance with some embodiments.

In some embodiments, region 206 is configured to convert data from first voltage domain 202 to data operating at second voltage domain 204. Region 206 is similar to region 106, first voltage domain 102 is similar to first voltage domain 202, and second voltage domain 104 is similar to second voltage domain 204, in some embodiments. Additionally or alternatively, region 206 includes one or more MBLS 200 that include a single control circuit 280 configured to toggle SBLS 222A and 222B between a normal state and a standby state according to a control signal, TOGL signal 207, which is received by control circuit 280. In some embodiments, another circuit (not shown, e.g., a power management circuit) in second voltage domain 204 generates TOGL signal 207.

In some embodiments, first voltage domain 202 includes general circuit(s) 203 correspondingly configured to operate in a region including a first voltage. Additionally or alternatively, second voltage domain 204 also includes general circuit(s) 205 configured to operate in a region including a second voltage. In some embodiments, general circuit(s) 203 and 205 include individual electronic components, such as resistors, transistors, capacitors, inductors and diodes, connected by conductive wires or traces through which electric current flows. Additionally or alternatively, operation of the combination of components and wires performs various simple and/or complex operations, e.g., signals are amplified, computations are performed, logic operations are executed, data is moved from one place to another, or the like. Regardless of the particular function(s) performed by general circuit(s) 203, general circuit(s) 203 outputs data signals to second voltage domain 204. After level-shifting (discussed below), the output signals of general circuit(s) 203 are provided to general circuit(s) 205 as corresponding input signals.

In some embodiments, MBLS 200 is configured to level adjust the data received from general circuit(s) 203 (which have levels corresponding to first voltage domain 202) so that, after being adjusted, the data has levels corresponding to second voltage domain 204, and then provide the data to general circuit(s) 205. In some embodiments, first voltage domain 202 is about 0.6V and second voltage domain 204 is about 0.9V. Additionally or alternatively, MBLS 200 is configured to include common FNW 250, SNWs 208, 212, a control circuit 280, an SBLS 222A and 222B and input circuits 216, 218.

In some embodiments, input circuits 216 and 218 receive data bits from general circuit(s) 203 in first voltage domain 202 that are to be converted to another voltage domain such as second voltage domain 204. Each input circuit 216 and 218 accepts a data bit (e.g., corresponding values of which represent a logical zero (0) or a logical one (1)) in some embodiments. Additionally or alternatively, MBLS 200 supports both voltage levels (e.g., 0.6V and 0.9V). In some embodiments, MBLS 200 is sufficiently robust to operate using both voltage levels (e.g., 0.6V and 0.9V). In some embodiments, MBLS 200 is compatible with both voltage levels (e.g., 0.6V and 0.9V). FNW 250 includes a voltage input for a first voltage domain and SNWs 208 and 212 include a voltage input for a second voltage domain, in some embodiments. Each of SBLS 222A and 222B outputs the corresponding data bits inputted at input circuits 216 and 218 albeit converted to another voltage domain, in some embodiments. TOGL signal 207 is received by control circuit 280. In some embodiments, a delayed version of TOGL signal 207, namely a signal TOGLd 782, is generated by control circuit 280 and distributed to each SBLS 222A and 222B. Signal TOGLd 782 toggles each of SBLS 222A and 222B between the normal mode and the standby mode. In some embodiments, the use of one control circuit 280 for multiple SBLS 222 conserves power and area within MBLS 200.

In some embodiments, the NWs, e.g., the FNWs and the SNWs, are N-type semiconductor regions created by doping an intrinsic semiconductor with an electron donor element during manufacture. Additionally or alternatively, N-type comes from the negative charge of the electron. In N-type semiconductors, electrons are the majority carriers and holes are the minority carriers in some embodiments. Additionally or alternatively, dopants for N-type silicon are phosphorus or arsenic. In some embodiments, a substrate is P-type and is connected (body-biased) to $V_{SS}$ and the N-type NW is connected (body-biased) to $V_{DD}$ or $V_{DDL}$ depending on the corresponding NW and/or corresponding voltage domain.

Figure 3:
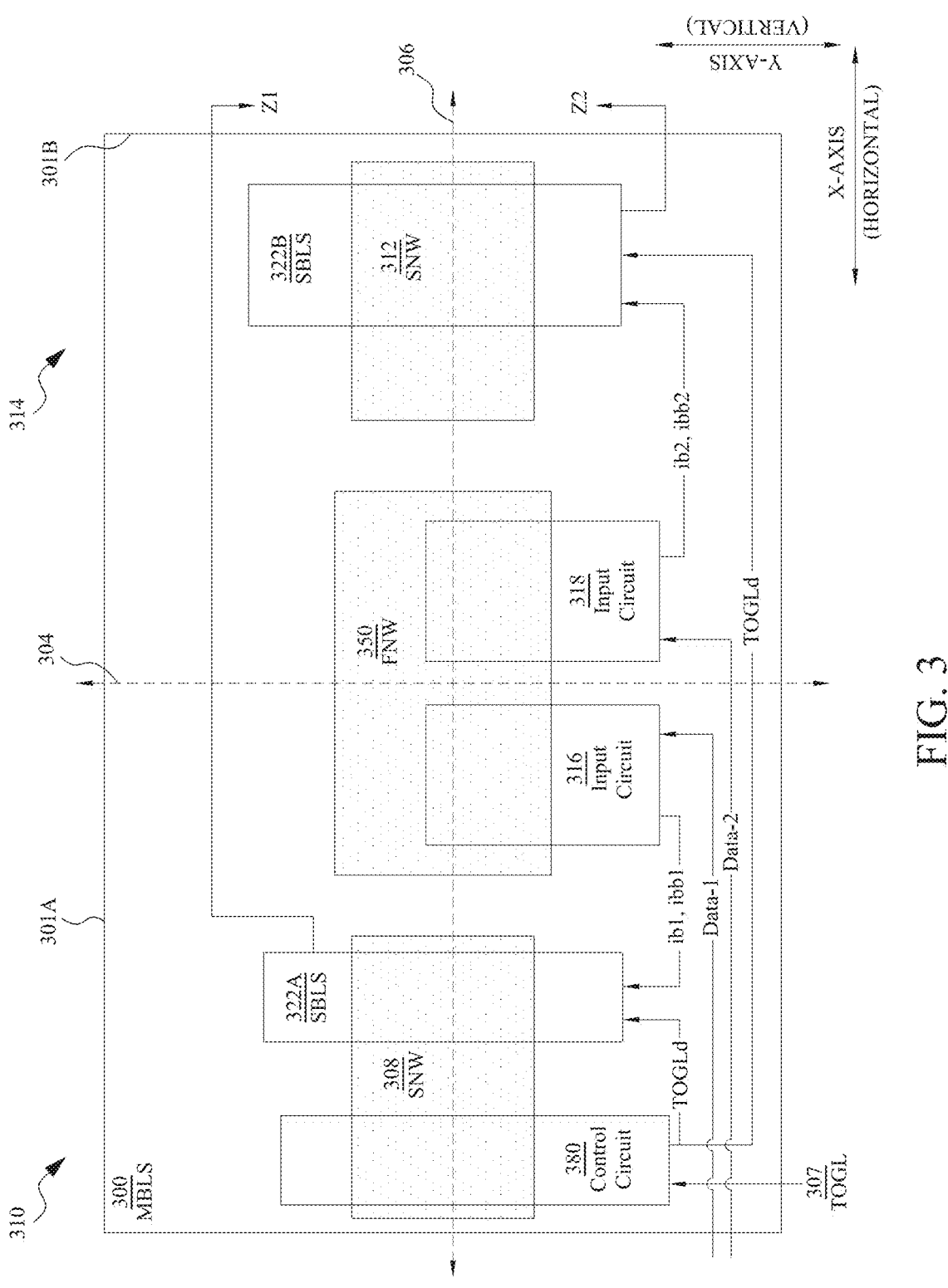
FIG. 3 is a block diagram of a multi-bit level shifter (MBLS) with two single-bit level shifters (SBLSs), in accordance with some embodiments.

FIG. 3 is a block diagram of a MBLS 300 with two SBLS 322A and 322B, in accordance with some embodiments.

MBLS 300 includes two instances of SBLS (discussed below), i.e., is multi-bit, and so is similar to MBLS 200. In some embodiments, MBLS 300 is used in region 106 in IC 100. In some embodiments, MBLS 300 includes a FNW 350 located at an intersection of a vertical axis 304 and a horizontal axis 306. In some embodiments, vertical axis 304 is placed anywhere along horizontal boundary 301A and horizontal axis 306 is placed anywhere along vertical boundary 301B in some embodiments. MBLS 300 also includes an SNW 308 located along horizontal axis 306 on a first side 310 of vertical axis 304, and a SNW 312 located along horizontal axis 306 on a second side 314 of vertical axis 304 in some embodiments. In some embodiments, horizontal axis 306 bisects each of SNW 308 and SNW 312. In some embodiments, horizontal axis 306 bisects FNW 350. In some embodiments, SNW 308 and SNW 312 are located along vertical axis 304. In some embodiments, vertical axis 304 and horizontal axis 306 are shown bisecting MBLS 300.

Additionally or alternatively, MBLS 300 also includes a first power supply node (see 670 FIG. 6) configured to have a first power supply voltage (e.g., $V_{DDL}$). In some embodiments, the first power supply node is at a first voltage domain voltage ($V_{DDL}$) and located within common FNW 350. In some embodiments, MBLS 300 also includes a second power supply node (see 770 FIG. 7) configured to have a second voltage domain voltage (e.g., $V_{DD}$). Additionally or alternatively, the second power supply is located within SNW 308 and/or SNW 312. MBLS 300 also includes input circuit 316 including: a first PMOS transistor (see P1 FIG. 6) positioned in FNW 350 on first side 310 of vertical axis 304 and including a first source/drain (S/D) terminal (FIG. 6) coupled to the first power supply node, and input circuit 318 including a second PMOS transistor (see P12 FIG. 6) positioned in FNW 350 on second side 314 of vertical axis 304 and including a second S/D terminal (FIG. 6) coupled to the first power supply node, where input circuits 316, 318 are configured to receive an input signal (see Data-1, Data-2 FIG. 6) having voltage levels which correspond to a first voltage domain, in some embodiments.

Additionally or alternatively, MBLS 300 also includes SBLS 322A including: a third PMOS transistor (see P5 FIG. 7) positioned in SNW 308 and including a third S/D terminal (FIG. 7) coupled to the second power supply node (see 770 FIG. 7) and a fourth PMOS transistor (see P6 FIG. 7) positioned in SNW 308 and including a fourth S/D terminal (FIG. 7) coupled to the second power supply node, where SBLS 322A receives data output signals from input circuit 316 and converts the data output signals from having levels which correspond to the first voltage domain to having levels which correspond to a second voltage domain.

Figure 7:
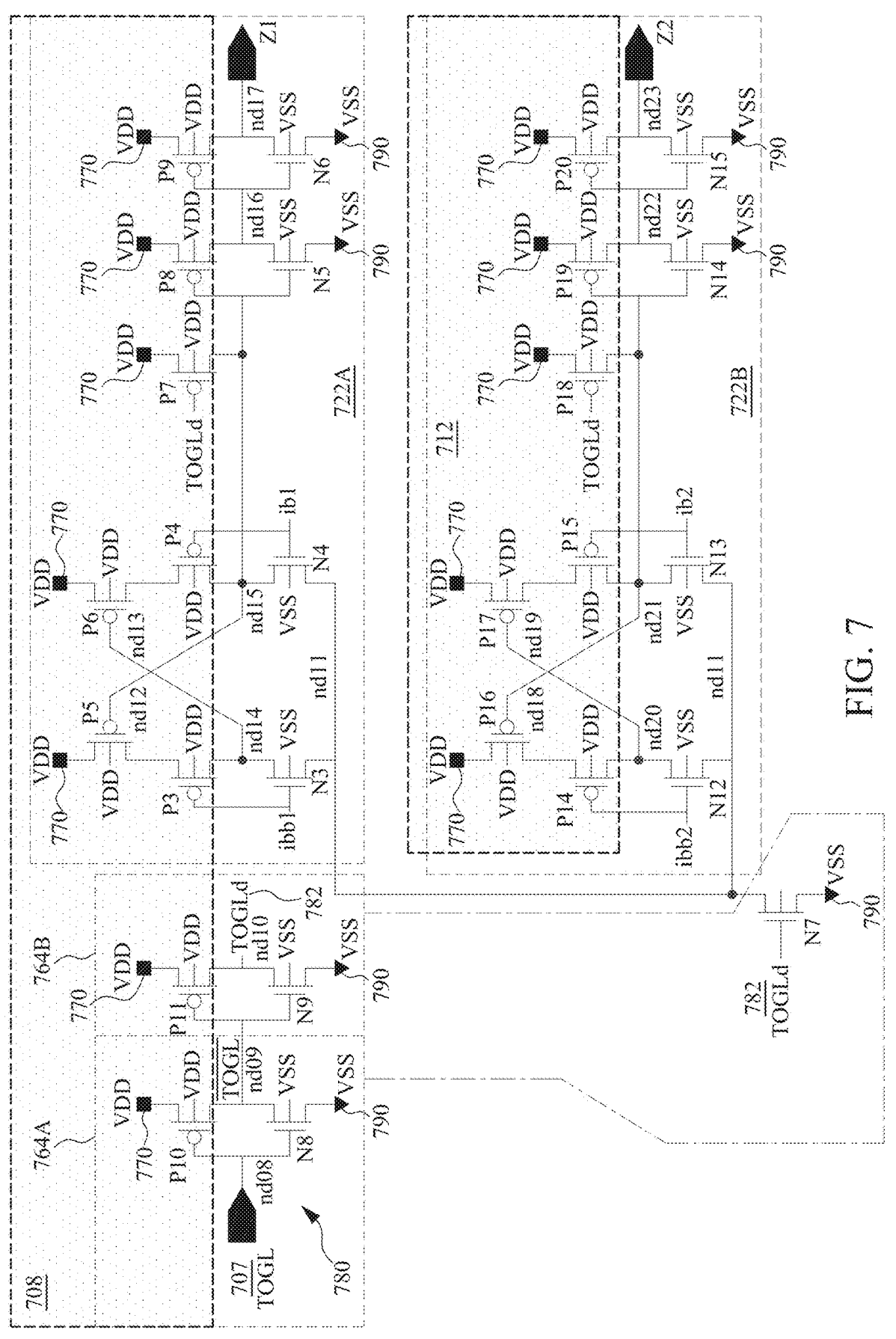
FIG. 7 is a block diagram of two SBLSs, in accordance with some embodiments.

Additionally or alternatively, MBLS 300 also includes SBLS 322B including: a fifth PMOS transistor (see P16 FIG. 7) positioned in SNW 312 and including a fifth S/D terminal (FIG. 7) coupled to the second power supply node (see 770 FIG. 7) and a sixth PMOS transistor (see P17 FIG. 7)

positioned in SNW 312 and including a sixth S/D terminal (FIG. 7) coupled to the second power supply node, where SBLS 322B receives data output signals from input circuit 318 and converts the data output signals from having levels which correspond to the first voltage domain to having levels which correspond to a second voltage domain.

In some embodiments, MBLS 300 also includes a control circuit 380 electrically coupled to SBLS 322A and 322B, and configured to generate and output TOGLd signal (782 FIG. 7) to each of SBLS 322A and 322B which causes SBLS 322A and 322B to toggle between a normal state and a standby state according to TOGL signal 307. In FIG. 3, control circuit 380 is located partially within SNW 308. Additionally or alternatively, control circuit 380 is located partially within SNW 312. In some embodiments, control circuit 380 is electrically coupled to the second power supply node (see 770 FIG. 7). Control circuit 380 includes PMOS transistors located within SNW 308 (FIG. 7) or SNW 312, in some embodiments. Additionally or alternatively, control circuit 380 outputs the TOGLd signal that when sent to SBLS 322A and 322B toggles each of SBLS 322 between a normal state and standby state. SBLS 322A is located at SNW 308 and another SBLS 322B is located at SNW 312.

In some embodiments, each of the inputs (e.g., Data-1, Data-2) arrives at input circuits 316 and 318 having levels which correspond to a first voltage domain (e.g., $V_{DDL}$). Additionally or alternatively, input circuits 316 and 318 then output data signals (e.g., ib1, ibb1, ib2, ibb2) at $V_{DDL}$ correspondingly to SBLS 322A and 322B. In some embodiments, SBLS 322A and 322B take the data signals (e.g., ib1, ibb1, ib2, ibb2) received from input circuits 316 and 318 and convert them to output data signals (e.g., Z1, Z2) at $V_{DD}$. Additionally or alternatively, Z1 (i.e., at $V_{DD}$) represents Data-1 (i.e., at $V_{DDL}$) and Z2 (i.e., at $V_{DD}$) represents Data-2 (i.e., at $V_{DDL}$), $V_{DD}$ i.e., Z1 and Z2 are level-shifted representations of corresponding Data-1 and Data-2.

Figure 4:
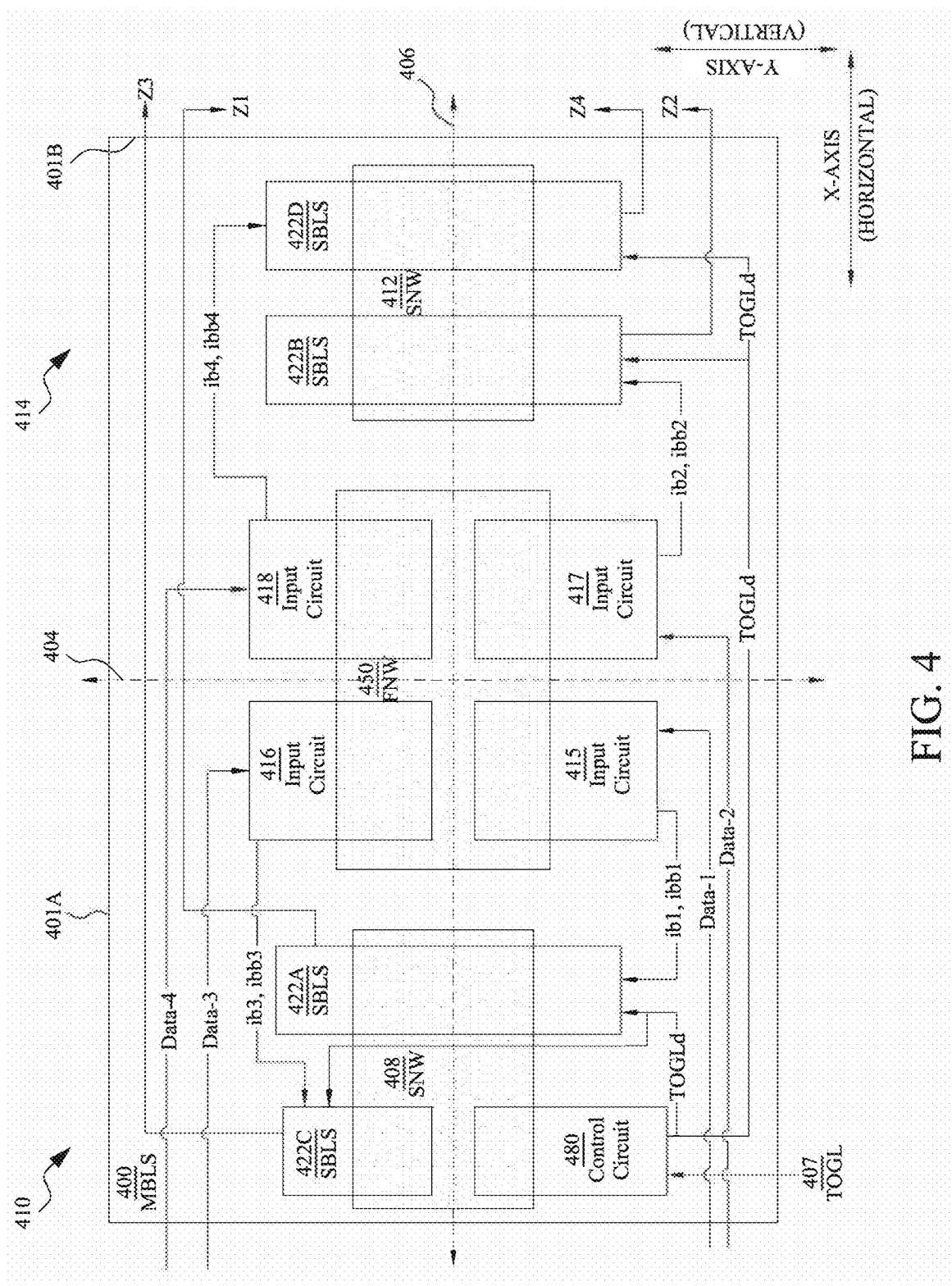
FIG. 4 is a block diagram of a MBLS with four SBLSs, in accordance with some embodiments.

FIG. 4 is a block diagram of a MBLS 400 with four SBLS 422A, 422B, 422C and 422D, in accordance with some embodiments.

MBLS 400 includes four instances of SBLS (discussed below), i.e., is multi-bit, and so is similar to MBLS 200 and 300. In some embodiments, MBLS 400 is used in region 106 in IC 100. In some embodiments, MBLS 400 is similar to MBLS 200 and 300 except that MBLS 400 is configured to convert four inputs from a first voltage domain to a second voltage domain where MBLS 200 and 300 are configured to convert two inputs from a first voltage domain to a second voltage domain.

In some embodiments, MBLS 400 includes a FNW 450 located at an intersection of a vertical axis 404 and a horizontal axis 406. Additionally or alternatively, MBLS 400 also includes a SNW 408 located along horizontal axis 406 on a first side 410 of vertical axis 404 and a SNW 412 located along horizontal axis 406 on a second side 414 of vertical axis 404. In some embodiments, horizontal axis 406 bisects each of SNW 408 and SNW 412. In some embodiments, horizontal axis 406 bisects FNW 450. In some embodiments, SNW 408 and 4NW 412 are located along vertical axis 404. In some embodiments, vertical axis 404 and horizontal axis 406 are shown bisecting MBLS 400.

Additionally or alternatively, MBLS 400 also includes a first power supply node (see 670 FIG. 6) configured to have a first power supply voltage (e.g., $V_{DDL}$). In some embodiments, the first power supply node is at a first voltage domain voltage ($V_{DDL}$) and located within common FNW 450. In some embodiments, MBLS 400 also includes a second power supply node (see 770 FIG. 7) configured to have a second voltage domain voltage (e.g., $V_{DD}$). Additionally or alternatively, the second power supply is located within SNW 408 and/or SNW 412. MBLS 400 also includes input circuit 416 including: a first PMOS transistor (see P1 FIG. 6) positioned in FNW 450 on first side 410 of vertical axis 404 and including a first source/drain (S/D) terminal (FIG. 6) coupled to the first power supply node, and input circuit 418 including a second PMOS transistor (see P12 FIG. 6) positioned in FNW 450 on second side 414 of vertical axis 404 and including a second S/D terminal (FIG. 6) coupled to the first power supply node, where input circuits 416, 418 are configured to receive an input signal (see Data-1, Data-4) having voltage levels which correspond to a first voltage domain, in some embodiments.

Additionally or alternatively, MBLS 400 also includes SBLS 422A including: a third PMOS transistor (see P5 FIG. 7) positioned in SNW 408 and including a third S/D terminal (FIG. 7) coupled to the second power supply node (see 770 FIG. 7) and a fourth PMOS transistor (see P6 FIG. 7) positioned in SNW 408 and including a fourth S/D terminal (FIG. 7) coupled to the second power supply node, where SBLS 422A receives data output signals from input circuit 415 and converts the data output signals from having levels which correspond to the first voltage domain to having levels which correspond to a second voltage domain.

Additionally or alternatively, MBLS 400 also includes SBLS 422B including: a fifth PMOS transistor (see P16 FIG. 7) positioned in SNW 412 and including a fifth S/D terminal (FIG. 7) coupled to the second power supply node (see 770 FIG. 7) and a sixth PMOS transistor (see P17 FIG. 7) positioned in SNW 412 and including a sixth S/D terminal (FIG. 7) coupled to the second power supply node, where SBLS 422B receives data output signals from input circuit 417 and converts the data output signals from having levels which correspond to the first voltage domain to having levels which correspond to a second voltage domain.

Additionally or alternatively, MBLS 400 also includes SBLS 422C including: a seventh PMOS transistor (see P5 FIG. 7) positioned in SNW 408 and including a seventh S/D terminal (FIG. 7) coupled to the second power supply node (see 770 FIG. 7) and an eighth PMOS transistor (see P6 FIG. 7) positioned in SNW 408 and including an eighth S/D terminal (FIG. 7) coupled to the second power supply node, where SBLS 422C receives data output signals from input circuit 416 and converts the data output signals from having levels which correspond to the first voltage domain to having levels which correspond to a second voltage domain.

Additionally or alternatively, MBLS 400 also includes SBLS 422D including: a ninth PMOS transistor (see P16 FIG. 7) positioned in SNW 412 and including a ninth S/D terminal (FIG. 7) coupled to the second power supply node (see 770 FIG. 7) and a tenth PMOS transistor (see P17 FIG. 7) positioned in SNW 412 and including a tenth S/D terminal (FIG. 7) coupled to the second power supply node, where SBLS 422D receives data output signals from input circuit 418 and converts the data output signals from having levels which correspond to the first voltage domain to having levels which correspond to a second voltage domain.

In some embodiments, MBLS 400 also includes a control circuit 480 electrically coupled to SBLS 422A, 422B, 422C and 422D, and configured to generate and output TOGLd signal (782 FIG. 7) to each of SBLS 422A, 422B, 422C and 422D which causes SBLS 422A, 422B, 422C and 422D to toggle between a normal state and a standby state according to TOGL signal 407. In FIG. 4, control circuit 480 is located partially within SNW 408. Additionally or alternatively, control circuit 480 is located partially within SNW 412. In some embodiments, control circuit 480 is electrically coupled to the second power supply node (see 770 FIG. 7). Control circuit 480 includes PMOS transistors located within SNW 408 (FIG. 7) or SNW 412, in some embodiments. Additionally or alternatively, control circuit 480 outputs the TOGLd signal that when sent to SBLS 422A, 422B, 422C and 422D toggles each of SBLS 422A, 422B, 422C and 422D between a normal state and standby state. SBLS 422A and 422C are located at SNW 408 and another SBLS 422B and 422D are located at SNW 412.

In some embodiments, each of the inputs (e.g., Data-1, Data-2, Data-3, and Data-4) arrives at input circuits 415, 416, 417, and 418 having levels which correspond to a first voltage domain (e.g., $V_{DDL}$). Additionally or alternatively, input circuits 415, 416, 417, and 418 then output data signals (e.g., ib1, ibb1, ib2, ibb2, ib3, ibb3, ib4, and ibb4) at $V_{DDL}$ correspondingly to SBLS 422A, 422B, 422C, and 422D. In some embodiments, SBLS 422A, 422B, 422C, and 422D take the data signals (e.g., ib1, ibb1, ib2, ibb2, ib3, ibb3, ib4, and ibb4) received from input circuits 415, 416, 417, and 418 and convert them to output data signals (e.g., Z1, Z2, Z3, and Z4) at $V_{DD}$. Additionally or alternatively, Z1 (i.e., at $V_{DD}$) represents Data-1 (i.e., at $V_{DDL}$), Z2 (i.e., at $V_{DD}$) represents Data-2 (i.e., at $V_{DDL}$), Z3 (i.e., at $V_{DD}$) represents Data-3 (i.e., at $V_{DDL}$), Z4 (i.e., at $V_{DD}$) represents Data-4 (i.e., at $V_{DDL}$). As such, output data signals Z1, Z2, Z3 and Z4 are level-shifted representations of corresponding inputs Data-1, Data-2, Data-3, and Data-4.

Figure 5:
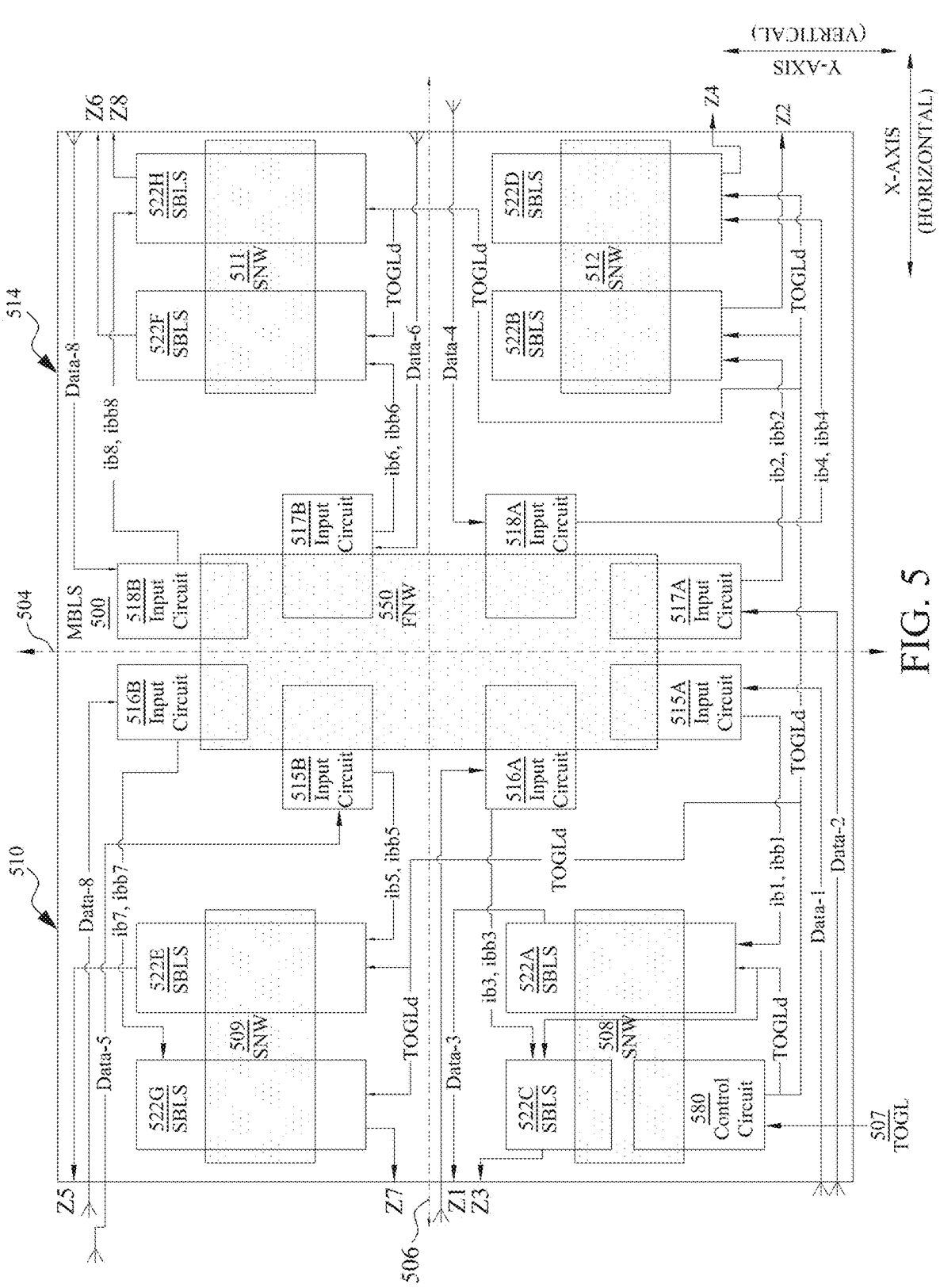
FIG. 5 is a block diagram of a MBLS with eight SBLSs, in accordance with some embodiments.

FIG. 5 is a block diagram of a MBLS 500 with eight SBLSs 522A, 522B, 522C, 522D, 522E, 522F, 522G, and 522H, in accordance with some embodiments.

MBLS 500 includes eight instances of an SBLS (discussed below), i.e., is multi-bit, and so similar to MBLS 200, 300 and 400. In some embodiments, MBLS 500 is used in region 106 in IC 100. In some embodiments, MBLS 500 is similar to MBLS 200, 300 and 400 except that MBLS 500 is configured to convert eight inputs from a first voltage domain to a second voltage domain where MBLS 200 and 300 are configured to convert two inputs from a first voltage domain to a second voltage domain and MBLS 400 is configured to convert four inputs from a first voltage domain to a second voltage domain.

In some embodiments, MBLS 500 includes a FNW 550 located at an intersection of a vertical axis 504 and a horizontal axis 506. MBLS 500 also includes an SNW 508 and SNW 509 located along horizontal axis 506 on a first side 510 of vertical axis 504, and a SNW 512 and SNW 511 located along horizontal axis 506 on a second side 514 of vertical axis 504 in some embodiments. In some embodiments, horizontal axis 506 bisects each of SNW 508, 509, 511, and 512. In some embodiments, horizontal axis 506 bisects FNW 550. In some embodiments, SNW 508, 509, 511, and 512 are located along vertical axis 504. In some embodiments, vertical axis 504 and horizontal axis 506 are shown bisecting MBLS 500.

Additionally or alternatively, MBLS 500 also includes a first power supply node (see 670 FIG. 6) configured to have a first power supply voltage (e.g., $V_{DDL}$). In some embodiments, the first power supply node is at a first voltage domain voltage ($V_{DDL}$) and located within common FNW 550. In some embodiments, MBLS 500 also includes a second power supply node (see 770 FIG. 7) configured to have a second voltage domain voltage (e.g., $V_{DD}$). Additionally or alternatively, the second power supply is located within SNW 508, 509, 511, and 512. MBLS 500 also includes input circuit 515A including: a first PMOS transistor (see P1 FIG. 6) positioned in FNW 550 on first side 510 of vertical axis 504 and including a first source/drain (S/D) terminal (FIG. 6) coupled to the first power supply node, and input circuit 517A including a second PMOS transistor (see P12 FIG. 6) positioned in FNW 550 on second side 514 of vertical axis 504 and including a second S/D terminal (FIG. 6) coupled to the first power supply node, where input circuits 515A, 515B, 516A, 516B, 517A, 517B, 518A, and 518B are configured to receive an input signal (see Data-1, Data-2, Data-3, Data-4, Data-5, Data-6, Data-7, and Data-8) having voltage levels which correspond to a first voltage domain, in some embodiments.

Additionally or alternatively, MBLS 500 also includes SBLS 522A including: a third PMOS transistor (see P5 FIG. 7) positioned in SNW 508 and including a third S/D terminal (FIG. 7) coupled to the second power supply node (see 770 FIG. 7) and a fourth PMOS transistor (see P6 FIG. 7) positioned in SNW 508 and including a fourth S/D terminal (FIG. 7) coupled to the second power supply node, where SBLS 522A receives data output signals from input circuit 515A and converts the data output signals from having levels which correspond to the first voltage domain to having levels which correspond to a second voltage domain.

Additionally or alternatively, MBLS 500 also includes SBLS 522B including: a fifth PMOS transistor (see P16 FIG. 7) positioned in SNW 512 and including a fifth S/D terminal (FIG. 7) coupled to the second power supply node (see 770 FIG. 7) and a sixth PMOS transistor (see P17 FIG. 7) positioned in SNW 512 and including a sixth S/D terminal (FIG. 7) coupled to the second power supply node, where SBLS 522B receives data output signals from input circuit 517A and converts the data output signals from having levels which correspond to the first voltage domain to having levels which correspond to a second voltage domain.

Additionally or alternatively, MBLS 500 also includes SBLS 522C including: a seventh PMOS transistor (see P5 FIG. 7) positioned in SNW 508 and including a seventh S/D terminal (FIG. 7) coupled to the second power supply node (see 770 FIG. 7) and an eighth PMOS transistor (see P6 FIG. 7) positioned in SNW 508 and including an eighth S/D terminal (FIG. 7) coupled to the second power supply node, where SBLS 522C receives data output signals from input circuit 516A and converts the data output signals from having levels which correspond to the first voltage domain to having levels which correspond to a second voltage domain.

Additionally or alternatively, MBLS 500 also includes SBLS 522D including: a ninth PMOS transistor (see P16 FIG. 7) positioned in SNW 512 and including a ninth S/D terminal (FIG. 7) coupled to the second power supply node (see 770 FIG. 7) and a tenth PMOS transistor (see P17 FIG. 7) positioned in SNW 512 and including a tenth S/D terminal (FIG. 7) coupled to the second power supply node, where SBLS 522D receives data output signals from input circuit 518A and converts the data output signals from having levels which correspond to the first voltage domain to having levels which correspond to a second voltage domain.

Additionally or alternatively, MBLS 500 also includes SBLS 522E including: an eleventh PMOS transistor (see P5 FIG. 7) positioned in SNW 509 and including an eleventh S/D terminal (FIG. 7) coupled to the second power supply node (see 770 FIG. 7) and a twelfth PMOS transistor (see P6 FIG. 7) positioned in SNW 509 and including a twelfth S/D terminal (FIG. 7) coupled to the second power supply node, where SBLS 522E receives data output signals from input circuit 515B and converts the data output signals from having levels which correspond to the first voltage domain to having levels which correspond to a second voltage domain.

Additionally or alternatively, MBLS 500 also includes SBLS 522F including: a thirteenth PMOS transistor (see P16 FIG. 7) positioned in SNW 511 and including a thirteenth S/D terminal (FIG. 7) coupled to the second power supply node (see 770 FIG. 7) and a fourteenth PMOS transistor (see P17 FIG. 7) positioned in SNW 511 and including a fourteenth S/D terminal (FIG. 7) coupled to the second power supply node, where SBLS 522F receives data output signals from input circuit 517B and converts the data output signals from having levels which correspond to the first voltage domain to having levels which correspond to a second voltage domain.

Additionally or alternatively, MBLS 500 also includes SBLS 522G including: a fifteenth PMOS transistor (see P5 FIG. 7) positioned in SNW 509 and including a fifteenth S/D terminal (FIG. 7) coupled to the second power supply node (see 770 FIG. 7) and a sixteenth PMOS transistor (see P6 FIG. 7) positioned in SNW 509 and including a sixteenth S/D terminal (FIG. 7) coupled to the second power supply node, where SBLS 522G receives data output signals from input circuit 516B and converts the data output signals from having levels which correspond to the first voltage domain to having levels which correspond to a second voltage domain.

Additionally or alternatively, MBLS 500 also includes SBLS 522H including: a seventeenth PMOS transistor (see P16 FIG. 7) positioned in SNW 511 and including a seventeenth S/D terminal (FIG. 7) coupled to the second power supply node (see 770 FIG. 7) and an eighteenth PMOS transistor (see P17 FIG. 7) positioned in SNW 511 and including a eighteenth S/D terminal (FIG. 7) coupled to the second power supply node, where SBLS 522H receives data output signals from input circuit 518B and converts the data output signals from having levels which correspond to the first voltage domain to having levels which correspond to a second voltage domain.

In some embodiments, MBLS 500 also includes a control circuit 580 electrically coupled to SBLS 522A, 522B, 522C, 522D, 522E, 522F, 522G, and 522H, and configured to generate and output TOGLd signal (782 FIG. 7) to each of SBLS 522A, 522B, 522C, 522D, 522E, 522F, 522G, and 522H which causes SBLS 522A, 522B, 522C, 522D, 522E, 522F, 522G, and 522H to toggle between a normal state and a standby state according to TOGL signal 507. In FIG. control circuit 580 is located partially within SNW 508. Additionally or alternatively, control circuit 580 is located partially within SNW 512, SNW 509, or SNW 511. In some embodiments, control circuit 580 is electrically coupled to the second power supply node (see 770 FIG. 7). Control circuit 580 includes PMOS transistors located within SNW 508 (FIG. 7), SNW 509, SNW 511, or SNW 512 in some embodiments. Additionally or alternatively, control circuit 580 outputs the TOGLd signal that when sent to SBLS 522A, 522B, 522C, 522D, 522E, 522F, 522G, and 522H toggles each of SBLS 522A, 522B, 522C, 522D, 522E, 522F, 522G, and 522H between a normal state and standby state. SBLS 522A and 522C is located at SNW 508, SBLS 522B and 522D is located at SNW 512, SBLS 522E and 522G is located at SNW 509 and SBLS 522F and 522H is located at SNW 511.

In some embodiments, each of the inputs (e.g., Data-1, Data-2, Data-3, Data-4, Data-5, Data-6, Data-7, and Data-8) arrives at input circuits 515A, 515B, 516A, 516B, 517A, 517B, 518A, and 518B having levels which correspond to a first voltage domain (e.g., $V_{DDL}$). Additionally or alternatively, input circuits 515A, 515B, 516A, 516B, 517A, 517B, 518A, and 518B then output data signals (e.g., ib1, ibb1, ib2, ibb2, ib3, ibb3, ib4, ibb4, ib5, ibb5, ib6, ibb6, ib7, ibb7, ib8, and ibb8) at $V_{DDL}$ correspondingly to SBLS 522A, 522B, 522C, 522D, 522E, 522F, 522G, and 522H. In some embodiments, SBLS 522A, 522B, 522C, 522D, 522E, 522F, 522G, and 522H take the data signals (e.g., ib1, ibb1, ib2, ibb2, ib3, ibb3, ib4, ibb4, ib5, ibb5, ib6, ibb6, ib7, ibb7, ib8, and ibb8) received from input circuits 515A, 515B, 516A, 516B, 517A, 517B, 518A, and 518B and convert them to output data signals (e.g., Z1, Z2, Z3, Z4, Z5, Z6, Z7, and Z8) at $V_{DD}$. Additionally or alternatively, Z1 (i.e., at $V_{DD}$) represents Data-1 (i.e., at $V_{DDL}$) and Z2 (i.e., at $V_{DD}$) represents Data-2 (i.e., at $V_{DDL}$), Z3 (i.e., at $V_{DD}$) represents Data-3 (i.e., at $V_{DDL}$) and Z4 (i.e., at $V_{DD}$) represents Data-4 (i.e., at $V_{DDL}$), Z5 (i.e., at $V_{DD}$) represents Data-5 (i.e., at $V_{DDL}$) and Z6 (i.e., at $V_{DD}$) represents Data-6 (i.e., at $V_{DDL}$), Z7 (i.e., at $V_{DD}$) represents Data-7 (i.e., at $V_{DDL}$) and Z8 (i.e., at $V_{DD}$) represents Data-8 (i.e., at $V_{DDL}$) i.e., Z1, Z2, Z3, Z4, Z5, Z6, Z7, and Z8 are level-shifted representations of corresponding Data-1, Data-2, Data-3, Data-4, Data-5, Data-6, Data-7, and Data-8.

Figure 6:
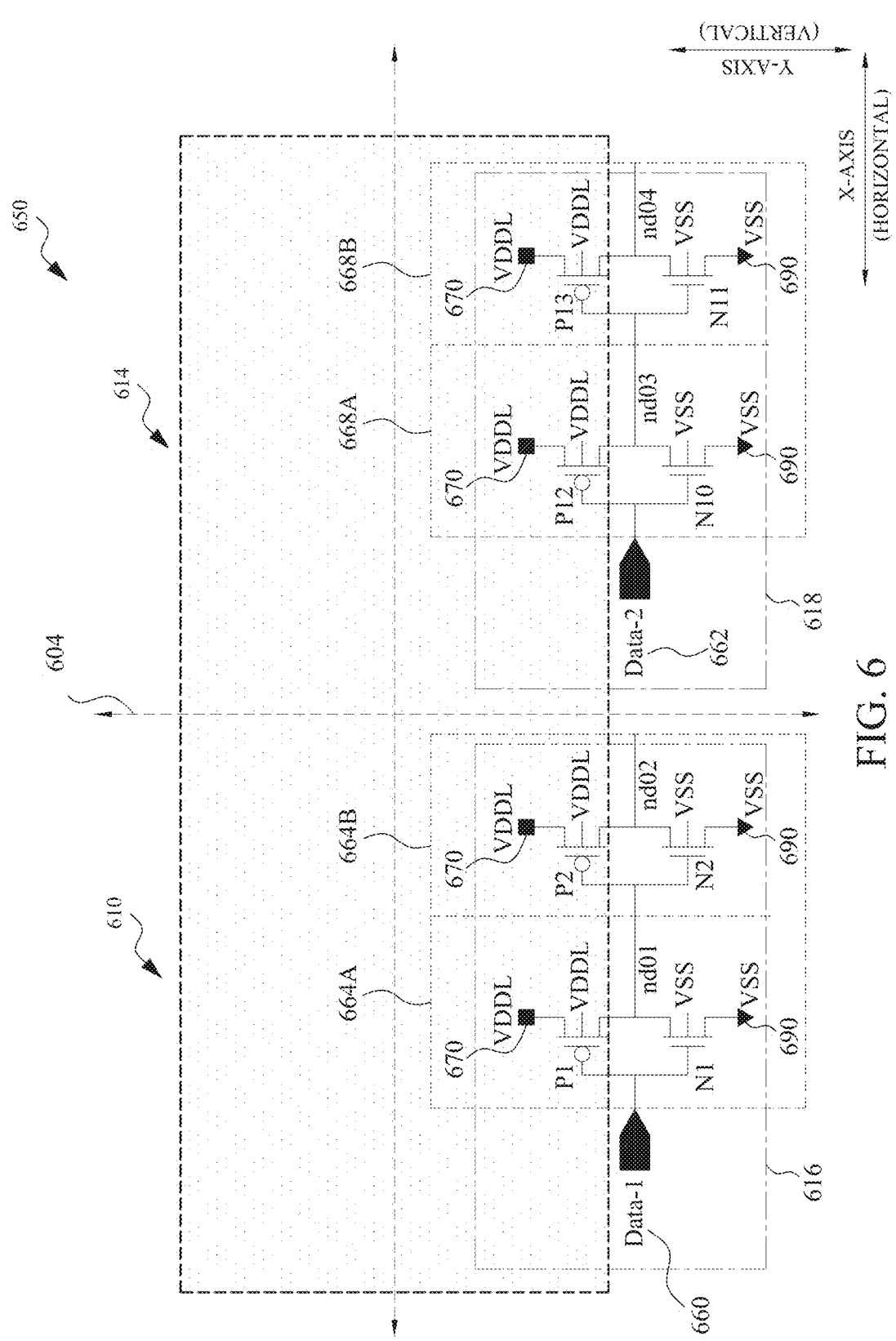
FIG. 6 is a block diagram of a first voltage domain NWELL (FNW), in accordance with some embodiments.

FIG. 6 is a block diagram of a first voltage domain NWELL (FNW) 650 in a 2-bit MBLS, in accordance with some embodiments.

Additionally or alternatively, FNW 650 is similar to FNW 250, 350, 450, and 550 of MBLS 200, 300, 400, and 500, and input circuits 616 and 618 are similar to input circuits 216, 218, 316 and 318. FNW 650 is also similar to FNW 450 in that FNW 650 includes first and second input circuits, e.g., input circuits 616 and 618 correspond to input circuits 415 and 417; FNW 650 also differs from FNW 450 in that FNW 650 does not include third and fourth input circuits, e.g., corresponding to additional input circuits 416 and 418. Additionally or alternatively, FNW 650 is similar to FNW 550 but also differs from FNW 550 in that FNW 650 includes six fewer input circuits as compared to FNW 550.

In some embodiments, the Data-1 signal is provided on an input 660 of input circuit 616 and the Data-2 signal is provided on input 662 of input circuit 618. The data signals Data-1 and Data-2 are received from a first voltage domain (e.g., $V_{DDL}$), such as voltage domain 102. Additionally or alternatively, input circuits 616 and 618 include cascading inverters 664A & 664B, and 668A & 668B.

In some embodiments, input circuit 616 includes PMOS transistors P1-P2 and NMOS transistors N1-N2. Together, transistors P1 and N1 represent inverter 664A. Gates of transistors P1 and N1 are coupled together and represent input 660 of inverter 664A. In particular, transistor P1 is coupled between first power supply node 670 and a node nd01, the latter representing the output of inverter 664A on which is provided the data signal ib1. Transistor N1 is coupled between node nd01 and a third power supply node 690 (e.g., VSS).

Together, transistors P2 and N2 represent inverter 664B. Gates of transistors P2 and N2 are coupled together and represent an input to inverter 664B, the input being coupled to node nd01. In particular, transistor P2 is coupled between first power supply node 670 and a node nd02, the latter representing the output of inverter 664B. Node nd02 also represents the output node of input circuit 616 on which is provided signal ibb1.

In some embodiments, input circuit 618 includes PMOS transistors P12-P13 and NMOS transistors N10-N13, and nodes nd03 and nd04. Transistors P12-P13 and N10-N11 correspond to transistors P1-P2 and N1-N2, and nodes nd03-nd04 correspond to nodes nd01-nd02, in terms of arrangements, coupling, or the like. The data signal ib2 is provided on node nd03. Node nd04 also represents the output node of input circuit 618 on which is provided signal ibb2.

In some embodiments, each of inverters 664A, 664B, 668A, 668B outputs a voltage representing the opposite logic-level relative to a corresponding input voltage, i.e., inverts the signal received as an input. Additionally or alternatively, regarding each of inverters 664A, 664B, 668A, 668B, when the applied input signal is low, the output signal becomes high, and vice versa. Inverters 664A, 664B, 668A, 668B include an NMOS transistor (labeled vice versa correspondingly as N1, N2, N10 and N11) and a PMOS transistor (labeled correspondingly as P1, P2, P12, and P13).

In some embodiments, a first power supply node, e.g., instances of power supply node 670, is configured to have a first power supply voltage (e.g., $V_{DDL}$). Additionally or alternatively, input circuits 616, 618 correspondingly include PMOS transistors P1 & P2 and P12 & P13 positioned in FNW 650. PMOS transistors P1, P2 are located on a first side 610 of vertical axis 604, and correspondingly include source/drain (S/D) terminals coupled to power supply node(s) 670, in some embodiments. Additionally or alternatively, PMOS transistors P12, P13 are positioned in FNW 650 on second side 614 of vertical axis 604, and correspondingly include S/D terminals coupled to power supply node 670. In some embodiments, each of input circuits 616, 618 is configured to receive a corresponding input signal (e.g., Data-1, Data-2) having voltage levels which correspond to a first voltage domain ($V_{DDL}$).

In some embodiments, a second power supply node, e.g., instances of power supply node(s) 690, is configured to have a second power supply voltage (e.g., VSS). Additionally or alternatively, input circuits 616, 618 include correspondingly NMOS transistors N1 & N2, and N10 & N11 positioned outside FNW 650. NMOS transistors N1, N2 are located on a first side 610 of vertical axis 604, and correspondingly include source/drain (S/D) terminals coupled to power supply node 690, in some embodiments. Additionally or alternatively, NMOS transistors N10 and N11 are positioned outside FNW 650 on second side 614 of vertical axis 604 and include S/D terminals coupled to power supply node 690.

In some embodiments, inverters 664A, 668A correspondingly receive the Data-1 and Data-2 signals as inputs, and correspondingly output inverted versions of Data-1 and Data-2 as outputs, namely as corresponding signals ib1 and ib2. That is, inverters 664, 664 invert Data-1 and Data-2 into corresponding signals ib1 and ib2. Additionally or alternatively, if Data-1 is high, ib1 is low and vice versa. If Data-2 is high, ib2 is low and vice versa in some embodiments. Inverters 664B, 668B then correspondingly invert the ib1 and ib2 inputs, in some embodiments. Inverters 664B, 668B correspondingly receive the ib1 and ib2 signals as inputs, and correspondingly output inverted versions of ib1 and ib2 as outputs, namely as corresponding signals ibb1 and ibb2. That is, inverters 664, 664 invert ib1 and ib2 into corresponding signals ibb1 and ibb2. Additionally or alternatively, if ib1 is low, ibb1 is high (e.g., like original Data-1 input) and vice versa. In some embodiments, if ib2 is low, ibb2 is high (e.g., like original Data-2 input) and vice versa. The signals ibb1 and ibb2 correspondingly have the same logical states as Data-1 and Data-2 but the signals ibb1 and ibb2 are correspondingly delayed with respect to Data-1 and Data-2. Additionally or alternatively, cascaded inverters 664A & 664B, and 668A & 668B act as corresponding buffers.

FIG. 7 is a block diagram of single bit SBLSs 722A and 722B, in accordance with some embodiments.

Additionally or alternatively, SBLSs 722A and 722B are similar to SBLS 222, 322, 422, and 522 of MBLS 200, 300, 400, 500 and control circuit 780 is similar to control circuit 280, 380, 480, and 580. SNW 708 and SNW 712 are also similar to SNWs 208, 212, 308, 312, 408, 412, 508, 509, 511 and 512 in that they all partially contain one SBLS (e.g., PMOS transistors) in some embodiments. SNWs 708 and 712 are also similar to SNWs 408 and 412 except that SNWs 408 and 412 correspondingly include additional SBLSs 422C and 422D, in some embodiments. Additionally or alternatively, SNWs 708 and 712 are similar to SNWs 508, 509, 511 and 512 except that SNWs 508, 509, 511 and 512 correspondingly include additional SBLSs 522C, 522D, 522E, 522F, 522G, and 522H, in some embodiments.

SNWs 708 and 712 are similar to SNWs 308 and 312 in some embodiments. Additionally or alternatively, SNWs 708 and 712 are located within a MBLS, such as MBLS 200, 300, 400 or 500. In some embodiments, SNWs 708 and 712 are partially occupied with SBLS 722A partially occupying SNW 708 and SBLS 722B partially occupying SNW 712. Additionally or alternatively, control circuit 780 is partially occupying SNW 708; however, control circuit 780 is also configured to be partially located within SNW 712. Regardless of whether SNWs 708 and 712 are within an MBLS 200, 300, 400, or 500 only one control circuit is needed for any MBLS in some embodiments. Additionally or alternatively, while the sharing of SNWs, as shown in FIGS. 2, 3, 4, 5, 6 and 7, assists in reducing the amount of area needed for the MBLS circuit, limiting each MBLS circuit to one control circuit also reduces the amount of space needed in the MBLS circuit as well as the amount of power needed by the MBLS circuit as less transistors are utilized when compared with other approaches.

In some embodiments, control circuit 780 is powered by $V_{DD}$ in the second voltage domain at second power supply node 770. Additionally or alternatively, a control signal 707, namely TOGL signal 707, is an input to control circuit 780 which is received from a second voltage domain, such as voltage domain 104. Control circuit 780 includes cascaded inverters 764A and 764B, in some embodiments.

In some embodiments, control circuit 780 includes PMOS transistors P10-P11 and NMOS transistors N7, N8 and N9. Together, transistors P10 and N8 represent inverter 764A. Gates of transistors P10 and N8 are coupled together and represent an input of inverter 764A, the input being coupled to a node nd08 on which is provided TOGL signal 707. In particular, transistor P10 is coupled between second power supply node 770 and a node nd09, the latter representing the output of inverter 764A on which is provided a signal TOGL (discussed below). Transistor N8 is coupled between node nd09 and a third power supply node 790 (e.g., VSS). Node nd09 also represents a first output node of control circuit 780.

Together, transistors P11 and N9 represent inverter 764B. Gates of transistors P11 and N9 are coupled together and represent an input to inverter 764B, the input being coupled to node nd09. In particular, transistor P11 is coupled between second power supply node 770 and a node nd10, the latter representing the output of inverter 764B on which is provided a signal TOGLd (discussed below). Transistor N9 is coupled between node nd10 and third power supply node 790. Node nd10 also represents a second output node of control circuit 780.

Transistor N7 is coupled between a node nd11 and third power supply node 790. The gate terminal of transistor is configured to receive the signal TOGLd (discussed below).

In some embodiments, each of inverters 764A and 764B outputs a voltage representing the opposite logic-level relative to a corresponding input voltage, i.e., inverts the corresponding input signal. Inverter 764A receives TOGL signal 707 and outputs an inverted version of TOGL signal 707, namely signal $\overline{\text{TOGL}}$. Inverter 764B receives the signal $\overline{\text{TOGL}}$ and outputs an inverted version of the signal $\overline{\text{TOGL}}$, namely a signal TOGLd. The TOGLd signal has the same logical state as TOGL signal 707 but the TOGLd signal is delayed with respect to TOGL signal 707. Accordingly, the suffix "d" indicates that the TOGLd signal is a delayed version of TOGL signal 707. Additionally or alternatively, when TOGL signal 707 is low, the signal TOGLd becomes high and vice versa. In some embodiments, each of inverters 764A and 764B includes a single NMOS transistor (correspondingly labeled as N8 and N9) and a single PMOS transistor (correspondingly labeled as P10 and P11). Additionally or alternatively, together, cascaded inverters 764A and 764B act to buffer TOGL signal 707 as an input to each of SBLSs 722A and 722B, wherein the buffered version of TOGL signal 707 is the TOGLd signal.

In some embodiments, each instance of power supply node 770 is configured to have a second power supply voltage (e.g., $V_{DD}$). Additionally or alternatively, control circuit 780 includes PMOS transistors P10 and P11 positioned in SNW 708. Each of PMOS transistors P10 and P11 includes an S/D terminal coupled to a corresponding instance of power supply node 770, in some embodiments.

In some embodiments, SNW 708 and SNW 712 are located along a horizontal axis or along a vertical axis of a MBLS, e.g., as shown in FIGS. 3, 4, 5, and 6. Additionally or alternatively, SNW 708 and SNW 712 are located adjacent to one another as shown in FIG. 7. A second power supply node 770 is configured to have a second power supply voltage (e.g., $V_{DD}$), in some embodiments. Additionally or alternatively, SBLS 722A includes several PMOS transistors (P3, P4, P5, P6, P7, P8, and P9) positioned in SNW 708 and includes S/D terminals coupled to second power supply node 770. In some embodiments, SBLS 722B includes several other PMOS transistors (P14, P15, P16, P17, P18, P19, and P20) positioned in SNW 712 and include S/D terminals coupled to second power supply node 770. SBLSs 722A and 722B receive input signals (e.g., ib1 & ibb1, and ib2 & ibb2) from input circuits, such as input circuits 616 and 618, and convert the input signals from the first voltage domain (e.g., $V_{DDL}$) to the second voltage domain (e.g., $V_{DD}$), in some embodiments. Additionally or alternatively, control circuit 780 is configured to toggle SBLSs 722A and 722B between a normal state and a standby state according to TOGL signal 707.

In FIG. 7, in addition to PMOS transistors P3-P9, SBLS 722A further includes NMOS transistors N3, N4, N5 and N6. Each of transistors P5-P9 has a source terminal coupled to an instance of first power supply node 770 ($V_{DD}$). Transistor P5 is coupled between first power supply node 770 and a node nd12. Transistor P3 is coupled between node nd12 and a node nd14. Transistor N3 is coupled between node nd14 and a node nd11. Transistor P6 is coupled between first power supply node 770 and a node nd13.

Transistor P4 is coupled between node nd13 and a node nd15. Transistor N4 is coupled between node nd15 and node nd11.

In SBLS 722A, the gate terminal of transistor P5 is coupled to node nd15. The gate terminal of transistor P6 is coupled to node nd14. In some embodiments, the gate terminals of transistors P5 and P6 are described as being cross-coupled with respect to corresponding nodes nd15 and nd14. The gate terminal of each of transistors P3 and N3 is coupled to signal ibb1. The gate terminal of each of transistors P4 and N4 is coupled to input signal ib1. Transistor P7 is coupled between first power supply node 770 and node nd15.

Together, transistors P8 and N5 represent an inverter. Gates of transistors P8 and N5 are coupled together and represent an input to the inverter, the input being coupled to node nd15. In particular, transistor P8 is coupled between first power supply node 770 and a node nd16, the latter representing the output of the inverter. Transistor N5 is coupled between node nd16 and a third power supply node 790.

Together, transistors P9 and N6 represent an inverter. Gates of transistors P9 and N6 are coupled together and represent an input to the inverter, the input being coupled to node nd16. In particular, transistor P9 is coupled between first power supply node 770 and a node nd17, the latter representing the output of the inverter. Transistor N6 is coupled between node nd17 and third power supply node 790. Node nd17 also represents the output node of SBLS 722A on which is provided output signal Z1.

In FIG. 7, in addition to PMOS transistors P14-P20, SBLS 722B further includes NMOS transistors N12, N13, N14 and N15, and nodes nd18, nd19, nd20, nd21, nd22 and nd23. Transistors P14-P20 and N12-N15 correspond to transistors P3-P9 and N3-N6, and nodes nd18-nd23 correspond to nodes nd12-nd17, in terms of arrangements, coupling, or the like. Node nd23 also represents the output node of SBLS 722B on which is provided output signal Z2.

In FIG. 7, when the signal TOGLd has a logical high value, SBLSs 722A and 722B are controlled to operate in the normal mode. When the signal TOGLd has a logical low value, SBLSs 722A and 722B are controlled to operate in the standby mode. The signal TOGLd is provided to the gate terminals of each of transistors N7, P7 and P18. For brevity, the operation of transistors N7 and P7 in relation to the operation of SBLS 722A will be discussed in detail. It is to be understood that the operation of transistors N7 and P18 in relation to the operation of SBLS 722B is similar to operation of transistors N7 and P7 in relation to the operation of SBLS 722A.

In the normal mode, i.e., when the signal TOGLd has a logical high value, transistor P7 is turned OFF and transistor N7 is turned ON. When transistor P7 is OFF, transistor P7 does not pull node nd15 up to $V_{DD}$. When transistor N7 is ON, transistor N7 attempts to pull node nd11 down to $V_{SS}$, which means that (1) transistor N3 will conduct current to node nd11 when transistor N3 is ON and/or (2) transistor N4 will conduct current to node nd11 when transistor N4 is ON.

Recalling that the gate terminals of transistors N3 and N4 are configured correspondingly to receive input signals ibb1 and ib1, and that input signal ibb1 is the inverse of input signal ib1, transistor N3 is OFF when transistor N4 is ON when input signal ibb1 has a logical high value, and vice versa. When transistor N4 is ON, it pulls node nd15 to $V_{SS}$ through transistor N7. When node nd15 is pulled to $V_{SS}$, transistor P5 is turned on, which pulls node nd12 up to $V_{DD}$. When transistor N4 is ON, again, transistor N3 is OFF; when transistor N3 is OFF, transistor P3 is ON, and so transistor P3 pulls node nd14 up to the voltage on node nd12, i.e., pulls node nd14 up to V$_{DD}$. When node nd14 is pulled up to V$_{DD}$, transistor P6 is turned OFF, and so does not pull node nd13 up to V$_{DD}$. When transistor N4 is ON, transistor P4 is OFF, and so transistor P4 does not attempt to pull node nd15 up to the voltage on node nd13.

In summary regarding the normal mode, when transistor N4 is turned ON because input signal ib1 has a logical high value, node nd15 is pulled down to V$_{SS}$. When node nd15 is at V$_{SS}$ (i.e., a logical low level), node nd16 is pulled up to V$_{DD}$ (i.e., a logical high level), and node nd17 is pulled to V$_{SS}$. When node nd17 is pulled to V$_{SS}$, the output Z1 of SBLS 722A is a logical low value such that output Z1 follows input signal ibb1 and is the inverse of input signal ib1. Thus, in the normal mode, the output Z1 of SBLS 722A is responsive to changes in the logical level of input signals ib1 and ibb1. Furthermore, input signals ib1 and ibb1 are, in effect, converted from levels which correspond to the first power domain, into corresponding output Z1, which has levels which correspond to the second power domain.

When transistor N4 is OFF, again, transistor N3 is ON; when transistor N3 is ON, transistor N3 pulls node nd14 down to V$_{SS}$ through transistor N7. When node nd14 is at V$_{SS}$, transistor P6 is turned ON, and so transistor P6 pulls node nd13 up to V$_{DD}$. When transistor N4 is OFF, it cannot pull node nd15 to V$_{SS}$. But when transistor N4 is OFF, transistor P4 is ON, and so transistor P4 attempts to pull node nd15 up to the voltage on node nd13, i.e., V$_{DD}$. When transistor P3 is OFF, it cannot attempt to pull node nd14 up to the voltage on node nd12. When node nd15 is pulled to V$_{DD}$, transistor P5 is turned OFF, and so transistor P5 cannot attempt to pull node nd12 up to V$_{DD}$.

In summary regarding the normal mode, when transistor N4 is turned OFF because input signal ib1 has a logical low value, transistors P6 and P4 pull node nd15 up to V$_{DD}$. When node nd15 is at V$_{DD}$ (i.e., a logical high level), node nd16 is pulled down to V$_{SS}$ (i.e., a logical low level), and node nd17 is pulled to V$_{DD}$. When node nd17 is pulled to V$_{DD}$, the output Z1 of SBLS 722A is a logical high value such that, again, output Z1 follows input signal ibb1 and is the inverse of input signal ib1. Thus, in the normal mode, again, the output Z1 of SBLS 722A is responsive to changes in the logical levels of input signals ib1 and ibb1. Furthermore, again, input signals ib1 and ibb1 are, in effect, converted from levels which correspond to the first power domain, into corresponding output Z1, which has levels corresponding to the second power domain.

In the standby mode, i.e., when the signal TOGLd has a logical low value, transistor P7 is turned ON and transistor N7 is turned OFF. When transistor N7 is OFF, transistor N7 cannot pull node nd11 down to V$_{SS}$, which means that (1) transistor N3 is not be able to conduct current to node nd11 when transistor N3 is ON and/or (2) transistor N4 is not be able to conduct current to node nd11 when transistor N4 is ON. Because neither transistor N3 nor N4 is able to conduct current to node nd11, overall power consumption of SBLS 722A is reduced. In the standby mode, in other words, the operation of transistors N3 and N4 does not affect the voltage on node nd15. Because of the operation of transistor p7 (discussed below), the operation of transistors P3-P6 will have little, if any effect, on node nd15.

When transistor P7 is ON, transistor P7 pulls node nd15 up to V$_{DD}$. When node nd15 is at V$_{DD}$ (i.e., a logical high level), node nd16 is pulled down to V$_{SS}$ (i.e., a logical low level), and node nd17 is pulled to V$_{DD}$. Moreover, when the signal TOGLd has a logical low value, the output Z1 of SBLS 722A is static at a logical high value regardless of the logical levels of input signals ib1 and ibb1. Accordingly, in the standby mode, output Z1 does not follow input signal ibb1, nor does output Z1 represent the inverse of input signal ib1. Thus, in the standby mode, again, the output Z1 of SBLS 722A is unresponsive to changes in the logical levels of input signals ib1 and ibb1.

In some embodiments, alternative versions of SBLSs 722A and 722B are provided in which transistors P7 and P18 of corresponding SBLSs 722A and 722B are replaced with first and second NMOS transistors (NFETs) (not shown). The first NFET is coupled between node nd15 and V$_{SS}$. The second NFET is coupled between node nd22 and V$_{SS}$. Each of the first and second NFETs is configured to receive the signal $\overline{TOGL}$. Similar to the foregoing, the discussion will focus on the operation of the alternate version of SBLS 722A because the operation of the alternate version of SBLS 722B is similar.

In the normal mode, regarding the alternate version of SBLS 722A, when the signal TOGLd has a logical high value, the signal $\overline{TOGL}$ has a logical low value, which turns OFF the first NFET. When turned OFF, the first NFET cannot pull node nd15 down to V$_{SS}$, and thus the first NFET has little, if any, effect on the output Z1 of the alternate version of SBLS 722A. Thus, in the normal mode, the output Z1 of the alternate version of SBLS 722A is responsive to changes in the logical levels of input signals ib1 and ibb1. Furthermore, input signals ib1 and ibb1 are, in effect, converted from levels which correspond to the first power domain, into corresponding output Z1, which has levels corresponding to the second power domain.

In the standby mode, regarding the alternate version of SBLS 722A, when the signal TOGLd has a logical low value, the signal $\overline{TOGL}$ has a logical high value, which turns ON the first NFET. When turned ON, the first NFET pulls node nd15 to V$_{SS}$. When node nd15 is at V$_{SS}$ (i.e., a logical low level), node nd16 is pulled up to V$_{DD}$ (i.e., a logical high level), and node nd17 is pulled to V$_{SS}$. Moreover, when the signal $\overline{TOGL}$ has a logical low value, the output Z1 of the alternate version of SBLS 722A is static at a logical low regardless of the logical levels of input signals ib1 and ibb1. Accordingly, in the standby mode, output Z1 of the alternate version of SBLS 722A does not follow input signal ibb1, nor does output Z1 represent the inverse of input signal ib1. Thus, in the standby mode, the output Z1 of alternate version of SBLS 722A is unresponsive to changes in the logical levels of input signals ib1 and ibb1.

In some embodiments, power management processing circuitry (not shown) generates TOGL signal 707 and provides the same to control circuit 780. Additionally or alternatively, control signal 707 is used to control when SBLSs 722A and 722B are not to be used and/or when power is to be conserved, e.g., by powering down SBLSs 722A and 722B. TOGLd signal 782 is received at the gate terminal of NMOS transistor N7 and at the gate terminals of PMOS transistors P7 and P18. The combination of TOGLd signal 782 at transistors N7 and P7, in effect, toggles SBLS 722A between a normal state and a standby state, in some embodiments. The combination of TOGLd signal 782 at transistors N7 and P18, in effect, toggles SBLS 722B between a normal state and a standby state, in some embodiments. In some embodiments, in a standby state leakage from each of SBLSs 722A and 722B determines the leakage of the MBLS.

Figure 8:
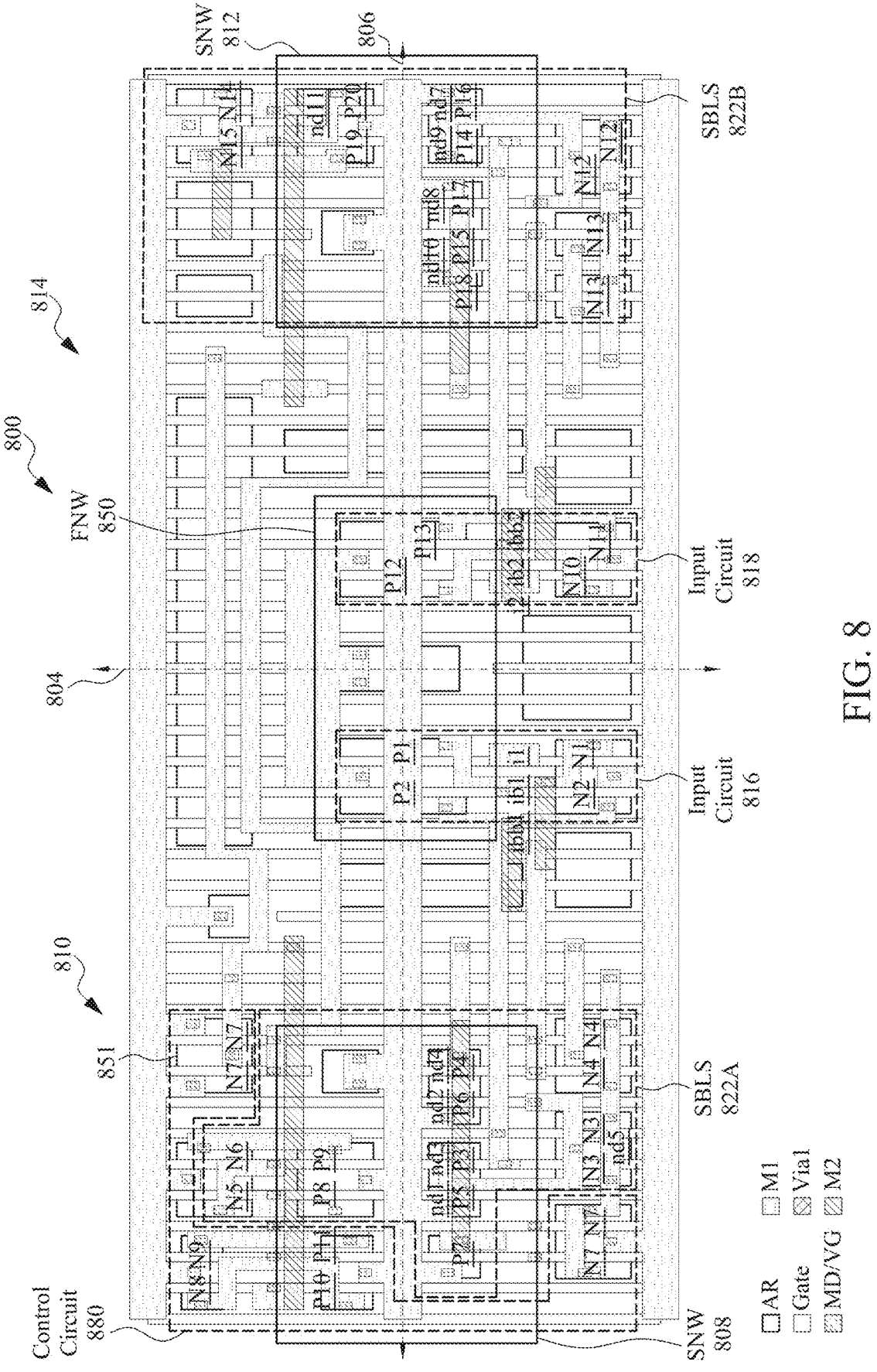
FIG. 8 is a layout diagram of a MBLS circuit structure, in accordance with some embodiments.
Figures 9A, 9B:
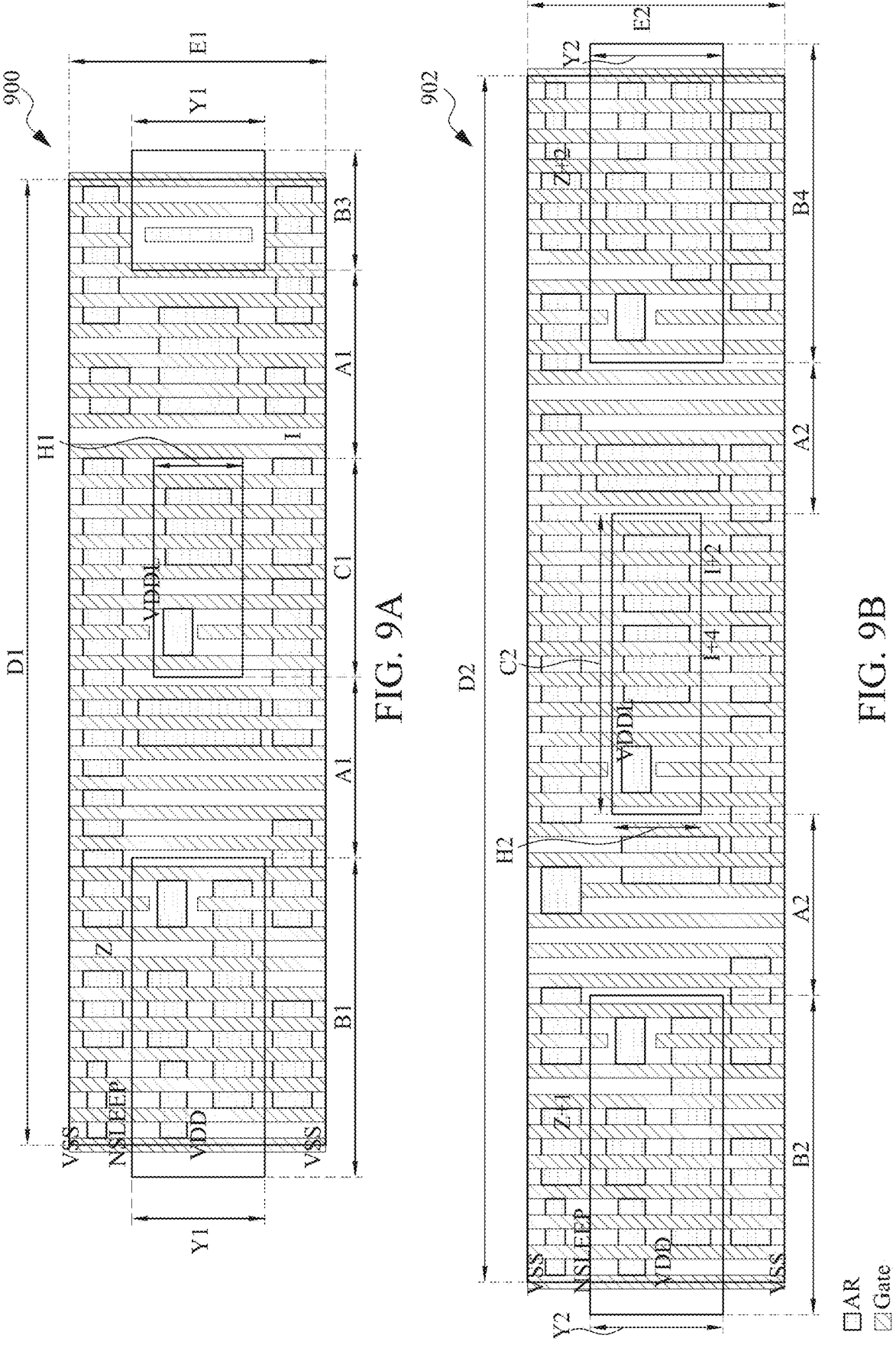
FIGS. 9A, 9B, 9C, and 9D are corresponding layout diagrams of SBLS circuit structures, in accordance with some embodiments.

FIGS. 8, 9B, 9C, and 9D are corresponding layout diagrams of MBLS circuit structures, in accordance with some embodiments, and FIG. 9A is a layout diagram of an SBLS.

The layout diagrams of FIGS. 8 and 9A-9D are representative of corresponding MBLS regions in corresponding semiconductor devices fabricated correspondingly in part according to the layout diagrams of FIGS. 8 and 9A-9D. As such, individual shapes (also known as patterns) in the layout diagrams of FIGS. 8 and 9A-9D are representative of corresponding individual structures in corresponding MBLS regions of corresponding semiconductor devices fabricated correspondingly in part according to the layout diagrams of FIGS. 8 and 9A-9D.

For simplicity of discussion, elements in the layout diagrams of FIGS. 8 and 9A-9D will be referred to as if they are structures rather than shapes per se. For example, each instance of shape 851 in the layout diagram of FIG. 8 is an active area shape which represents an active region in a corresponding semiconductor device. In the following discussion, each instance of shape 851 is referred to correspondingly as an instance of active region rather than as an instance of active area pattern.

FIG. 8 is a layout diagram of a MBLS 800 circuit structure, in accordance with some embodiments.

MBLS 800 includes two instances of an SBLS (discussed below), i.e., is multi-bit, and so similar to MBLS 200, 300, 400 and 500. In some embodiments, MBLS 800 is used in region 106 in IC 100. In some embodiments, MBLS 800 is similar to MBLS 200, 300, 400, and 500 except that MBLS 800 is configured to convert two inputs from a first voltage domain to a second voltage domain where MBLS 400 is configured to convert four inputs from a first voltage domain to a second voltage domain and MBLS 500 is configured to convert eight inputs from a first voltage domain to a second voltage domain.

In some embodiments, MBLS 800 includes a FNW 850 located at an intersection of a vertical axis 804 and a horizontal axis 806. MBLS 800 also includes an SNW 808 located along horizontal axis 806 on a first side 810 of vertical axis 804, and a SNW 812 located along horizontal axis 806 on a second side 814 of vertical axis 804 in some embodiments. In some embodiments, horizontal axis 806 bisects each of SNW 808 and 812. In some embodiments, horizontal axis 806 bisects FNW 850. In some embodiments, SNW 808 and 812 are located along vertical axis 804. In some embodiments, vertical axis 804 and horizontal axis 806 are shown bisecting MBLS 800.

Additionally or alternatively, MBLS 800 also includes a first power supply node (see 670 FIG. 6) configured to have a first power supply voltage (e.g., $V_{DDL}$). In some embodiments, the first power supply node is at a first voltage domain voltage ($V_{DDL}$) and located within common FNW 850. In some embodiments, MBLS 800 also includes a second power supply node (see 770 FIG. 7) configured to have a second voltage domain voltage (e.g., $V_{DD}$). Additionally or alternatively, the second power supply is located within SNW 808 and 812. MBLS 800 also includes input circuit 816 including: a first PMOS transistor P1 positioned in FNW 850 on first side 810 of vertical axis 804 and including a first source/drain (S/D) terminal (FIG. 6) coupled to the first power supply node, and input circuit 818 including a second PMOS transistor P12 positioned in FNW 850 on second side 814 of vertical axis 804 and including a second S/D terminal (FIG. 6) coupled to the first power supply node, where input circuits 816 and 818 are configured to receive an input signal (see i1 and i2) having voltage levels which correspond to a first voltage domain, in some embodiments.

Additionally or alternatively, MBLS 800 also includes SBLS 822A including: a third PMOS transistor P5 positioned in SNW 808 and including a third S/D terminal (FIG. 7) coupled to the second power supply node (see 770 FIG. 7) and a fourth PMOS transistor P6 positioned in SNW 808 and including a fourth S/D terminal (FIG. 7) coupled to the second power supply node, where SBLS 822A receives data output signals from input circuit 816 and converts the data output signals from having levels which correspond to the first voltage domain to having levels which correspond to a second voltage domain.

Additionally or alternatively, MBLS 800 also includes SBLS 822B including: a fifth PMOS transistor P16 positioned in SNW 812 and including a fifth S/D terminal (FIG. 7) coupled to the second power supply node (see 770 FIG. 7) and a sixth PMOS transistor P17 positioned in SNW 812 and including a sixth S/D terminal (FIG. 7) coupled to the second power supply node, where SBLS 822B receives data output signals from input circuit 818 and converts the data output signals from having levels which correspond to the first voltage domain to having levels which correspond to a second voltage domain.

In some embodiments, MBLS 800 also includes a control circuit 880 electrically coupled to SBLS 822A and 822B and configured to generate and output TOGLd signal (782 FIG. 7) to each of SBLS 822A and 822B which causes SBLS 822A and 822B to toggle between a normal state and a standby state according to a TOGL signal. In FIG. 8, control circuit 880 is located partially within SNW 808. Additionally or alternatively, control circuit 880 is located partially within SNW 812. In some embodiments, control circuit 880 is electrically coupled to the second power supply node (see 770 FIG. 7). Control circuit 880 includes PMOS transistors, P10 and P11, located within SNW 808 in some embodiments. Additionally or alternatively, control circuit 880 outputs the TOGLd signal that when sent to SBLS 822A and 822B toggles each of SBLS 822A 822B between a normal state and standby state. SBLS 822A is located at SNW 808 and SBLS 822B is located at SNW 812.

In some embodiments, each of the inputs (e.g., i1 and i2) arrive at input circuits 816 and 818 having levels which correspond to a first voltage domain (e.g., $V_{DDL}$). Additionally or alternatively, input circuits 816 and 818 then output data signals (e.g., ib1, ibb1 and ib2, ibb2) at $V_{DDL}$ correspondingly to SBLS 822A and 822B. In some embodiments, SBLS 822A and 822B take the data signals (e.g., ib1, ibb1 and ib2, ibb2) received from input circuits 816 and 818 and convert them to output data signals (e.g., Z1 and Z2) at $V_{DD}$. Additionally or alternatively, Z1 (i.e., at $V_{DD}$) represents i1 (i.e., at $V_{DDL}$) and Z2 (i.e., at $V_{DD}$) represents i2 (i.e., at $V_{DDL}$) i.e., Z1 and Z2 are level-shifted representations of corresponding i1 and i2.

FIGS. 9A, 9B, 9C, and 9D are corresponding layout diagrams of MBLS circuit structures, in accordance with some embodiments.

Figures 9C, 9D:
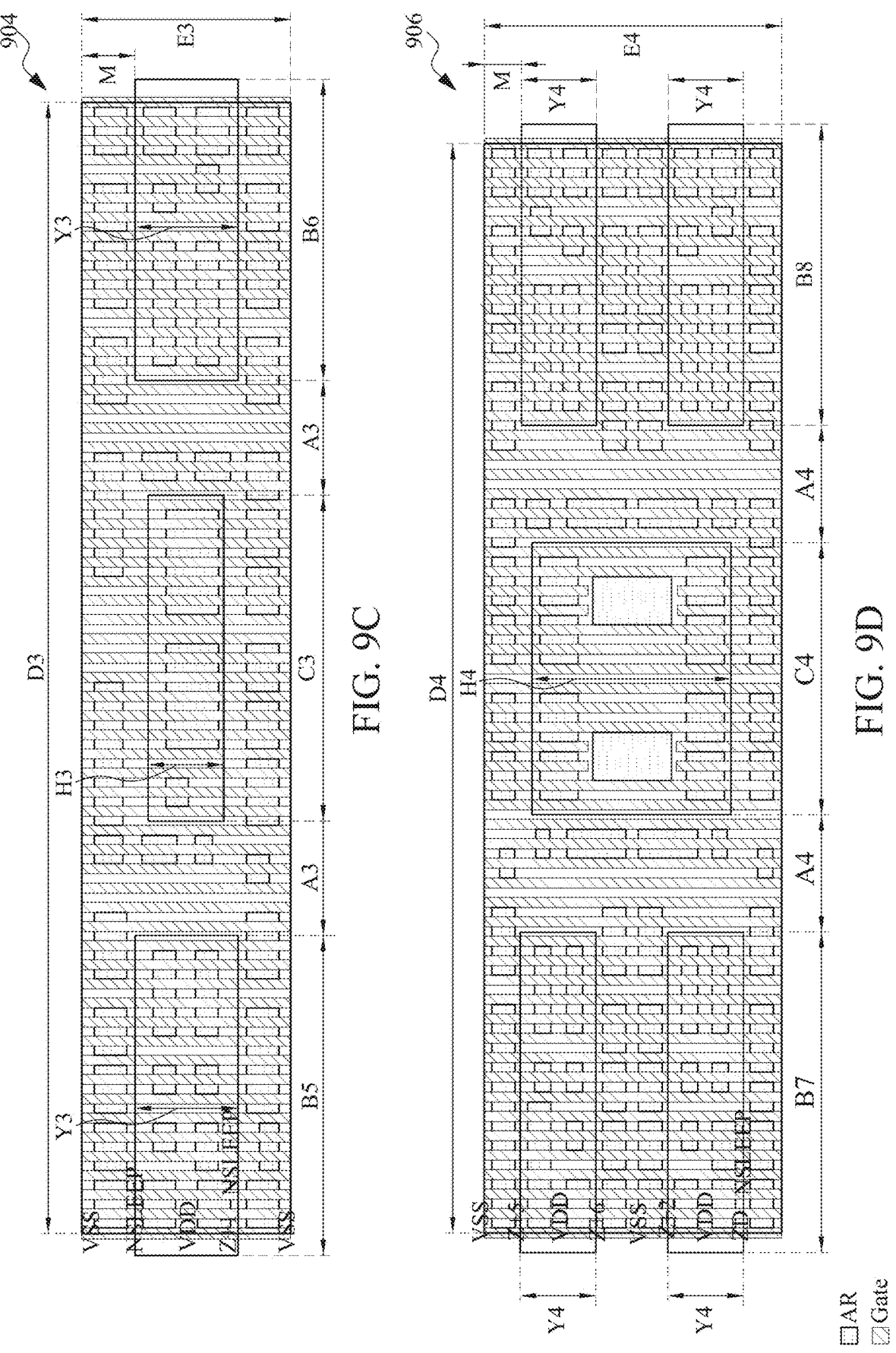

Additionally or alternatively, FIG. 9A is a layout diagram of a SBLS 900. FIG. 9B is a layout diagram of MBLS 902 in some embodiments. MBLS 902 is similar to MBLS 200, 300 or 800 in some embodiments. Additionally or alternatively, FIG. 9C is a layout diagram of a MBLS 904. MBLS 904 is similar to MBLS 400 in some embodiments. In some embodiments, FIG. 9D is a layout diagram of an MBLS 906. MBLS 906 is similar to MBLS 500 in some embodiments. Additionally or alternatively, each of SBLS 900 and MBLS 902, 904 and 906 is used in IC 100 in region 106.

In some embodiments, each of SBLS 900 and MBLS 902, 904 and 906 is labeled with various alphanumeric representations. Additionally or alternatively, the numeric representations 1, 2, 3, and 4 correlate with single bit (1), 2-bit (2), 4-bit (3) and 8-bit (4). D represents the cell pitch for each of SBLS 900 (D1) and MBLS 902 (D2), 904 (D3) and 906 (D4) in some embodiments. Additionally or alternatively, E represents the cell height for each of SBLS 900 (E1) and MBLS 902 (E2), 904 (E3) and 906 (E4). In some embodiments, A represents a NW gap for each of SBLS 900 (A1) and MBLS 902 (A2), 904 (A3) and 906 (A4). Additionally or alternatively, B represents $V_{DD}$ SNW width for each of SBLS 900 (B1, B3) and MBLS 902 (B2, B4), 904 (B5, B6) and 906 (B7, B8). In some embodiments, C represents $V_{DDL}$ FNW width for each of SBLS 900 (C1) and MBLS 902 (C2), 904 (C3) and 906 (C4). Additionally or alternatively, Y represents $V_{DD}$ SNW height for each of SBLS 900 (Y1) and MBLS 902 (Y2), 904 (Y3) and 906 (Y4). In some embodiments, H represents $V_{DDL}$ FNW height for each of SBLS 900 (H1) and MBLS 902 (H2), 904 (H3) and 906 (H4).

FIG. 10 is a table, in accordance with some embodiments.

Additionally or alternatively, FIG. 10 is a table showing the relationship between the layout characteristics between SBLS 900 of FIG. 9A and MBLSs 902, 904, and 906 of corresponding FIGS. 9B-9D.

The cell height is the same for each of SBLS 900, and MBLSs 902-904 as E1=E2=E3, and the height is doubled for MBLS 906 (e.g., E4=2E3) when implemented in an 8-bit design, such as MBLS 906 in some embodiments. Additionally or alternatively, the gap between SNW and FNW remains the same throughout SBLS 900 and MBLSs 902, 904, and 906 as A1=A2=A3=A4. In some embodiments, $V_{DD}$ SNW height also remains the same for each of SBLS 900, MBLS 902, 904, and 906 as Y1=Y2=Y3=Y4.

In some embodiments, the cell pitch, D, increases as the bit size increases as D3 is greater than D2 and D2 is greater than D1. Additionally or alternatively, D4, for the 8 bit MBLS 906, has a smaller pitch than D3 but still greater than D2. Thus, MBLS 906 cell pitch is smaller than MBLS 904, but larger than MBLS 902 in some embodiments.

In some embodiments, the $V_{DD}$ SNW width in MBLS 902 is less than twice the $V_{DD}$ SNW width in SBLS 900, the $V_{DD}$ SNW width in MBLS 904 is less than twice the $V_{DD}$ SNW width in MBLS 902, and the $V_{DD}$ SNW width in MBLS 906 is equal to the $V_{DD}$ SNW width in MBLS 904. In some embodiments, the $V_{DDL}$ FNW width increases for each MBLS until MBLS 906 where C4 is less than C3. Additionally or alternatively, $V_{DDL}$ FNW height remains proportional to cell height that is the same for all MBLS, except MBLS 906 that is double the height of the other MBLS. Additionally or alternatively, by using one control circuit correspondingly for each of MBLS 902, 904 and 906, an area savings of 39% or greater is realized.

FIG. 11 is a flowchart of a method 1100 of converting data between voltage domains, in accordance with some embodiments.

While method 1100 is shown with successive steps, the method 1100 does not necessarily need to be performed according to the sequence of steps shown in FIG. 11. In some embodiments, each of the steps of method 1100 is performed concomitantly or in most any order unless it's stated there is a specific order. Additionally or alternatively, additional operations are performed before, during, and/or after method 1100 depicted in FIG. 11, and that some other processes are only briefly described herein.

In FIG. 11, the flowchart includes blocks 1110, 1112, 1114, 1120, 1130 and 1132. At block 1110, a MBLS receives first and second power supply voltages. An example of such an MBLS is MBLS 300 of FIG. 3, which includes input circuits 316 and 318 and SBLS 322A and 322B, and wherein input circuits 616 and 618 are correspondingly more detailed examples of input circuits 316 and 318 and SBLS 722A and 722B are correspondingly more detailed examples of SBLS 322A and 322B. Continuing the example, $V_{DDL}$ is received at instances of power supply node 670 of FIG. 6, which are within FNW 650. $V_{DD}$ is received at power supply node(s) 770 within SNWs 708 and 712 in some embodiments. From block 1110, flow proceeds to block 1112.

At block 1112, input circuits electrically connected to the first power supply voltage receive inputs from a first voltage domain, wherein the latter operates at the first power supply voltage. An example of an MBLS in which the input circuits are included is MBLS 300 of FIG. 3, which includes input circuits 316 and 318, and wherein input circuits 616 and 618 are correspondingly more detailed examples of input circuits 316 and 318. Additional examples of the input circuits include input circuits 616 and 618 (FIG. 6) which correspondingly receive Data-1 and Data-2 inputs from a first voltage domain, such as voltage domain 102. From block 1112, flow proceeds to block 1114.

At block 1114, input circuits output the inputs from the first voltage domain to two or more corresponding SBLSs that operate in a second voltage domain and are electrically connected to a second power supply. Examples of the input circuits include input circuits 316 and 318 of MBLS 300 that output ib1, ibb1, ib2, ibb2 from the first voltage domain, FNW 350, to SBLSs 322A and 322B, where SBLSs 722A-722B are electrically connected to second power supply node(s) 770. From block 1114, flow proceeds to block 1120.

At block 1120, the two or more corresponding SBLSs convert, correspondingly, the inputs from the first voltage domain to the second voltage domain (1120). Examples of the two or more SBLSs include each of SBLSs 322A and 322B of MBLS 300 that receive inputs ib1, ibb1, ib2 and ibb2 and output Z1 and Z2 at $V_{DD}$. From block 1120, flow proceeds to block 1130.

At block 1130, SBLSs receive an input from a control circuit. Examples of SBLSs that receive an input from a control circuit include SBLSs 722A and 722B that receive control signal 707 inputted to control circuit 780 (FIG. 7). From block 1130, flow proceeds to block 1132.

At block 1132, SBLSs toggle between a normal state and a standby state according to the control signal received from the control circuit. An example includes SBLSs 722A and 722B that toggle between a normal state and a standby state based on control signal 707 (e.g., TOGL) inputted to control circuit 780 (FIG. 7) in some embodiments.

Figure 12:
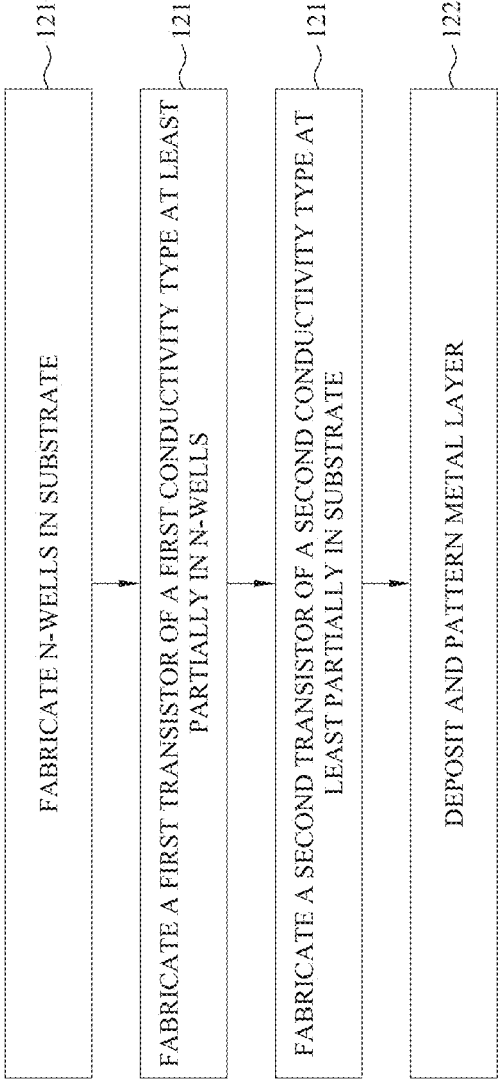
FIG. 12 is a flowchart of a method of manufacturing a semiconductor device, in accordance with some embodiments.

FIG. 12 is a flowchart of a method of manufacturing a semiconductor device, in accordance with some embodiments.

Additionally or alternatively, additional operations are performed before, during, and/or after method 1200 depicted in FIG. 12, and that some other processes are only briefly described herein. Examples of semiconductor devices which are manufactured according to method 1200 include semiconductor devices according to the layout diagrams of corresponding FIGS. 8, 9B, 9C, and 9D, or the like.

FIG. 12 includes blocks 1210, 1212, 1214 and 2120. At block 1210 of method 1200, a first voltage domain NW and a second voltage domain NW semiconductor structures are fabricated in a substrate. As a non-limiting example, in the embodiments as shown in FIG. 3, NWs 350, 308 and 312 are fabricated atop or within the substrate. Continuing the example, FNW 350 and the SNWs 308 and 312 are N-type semiconductor regions created by doping an intrinsic semiconductor with an electron donor element and the substrate is P-type and is connected (body-biased) to $V_{SS}$ and FNW 350 is connected (body-biased) to $V_{DDL}$ and SNWs 308 and 312 are connected (body-biased) to $V_{DD}$. From block 1210, flow proceeds to block 1212.

At block 1212 of method 1200, transistors of a first conductivity are fabricated at least partially in each of the NWs. As a non-limiting example, as shown in FIGS. 6 and 7, PMOS transistors P1, P2, P12 and P13 are fabricated in FNW 650 and PMOS transistors P3-P11 are fabricated in SNW 708 and PMOS transistors P14-P20 are fabricated in SNW 712. From block 1212, flow proceeds to block 1214.

At block 1214 of method 1200, a second transistor of a second conductivity type is fabricated at least partially in the substrate. As a non-limiting example, as shown in FIGS. 6 and 7, NMOS transistors N1, N2, N10 and N11 are fabricated outside of FNW 650, NMOS transistors N3-N9 are fabricated outside of SNW 708 and NMOS transistors N12-N15 are fabricated outside of SNW 712 in some embodiments. From block 1214, flow proceeds to block 1220.

At block 1220 of method 1200, a metal layer is deposited and patterned. As a non-limiting example, in the embodiments as shown in FIGS. 6 and 7, metal interconnects electrically couple PMOS transistors within FNW 650, SNW 708, and SNW 712 to NMOS transistors outside of FNW 650, SNW 708 and SNW 712 in some embodiments. As a continuation of the non-limiting example, metal interconnects extend between nodes (e.g., nd01-nd23) and electrically couple inverters (e.g., 664A, 764A; see also FIG. 8) with other inverters (e.g., 664B, 764B; see also FIG. 8) and with other devices such as PMOS transistors (e.g., PMOS transistor P7 or P18; see also FIG. 8) or NMOS transistors (e.g., NMOS transistor N7; see also FIG. 8).

Figure 13:
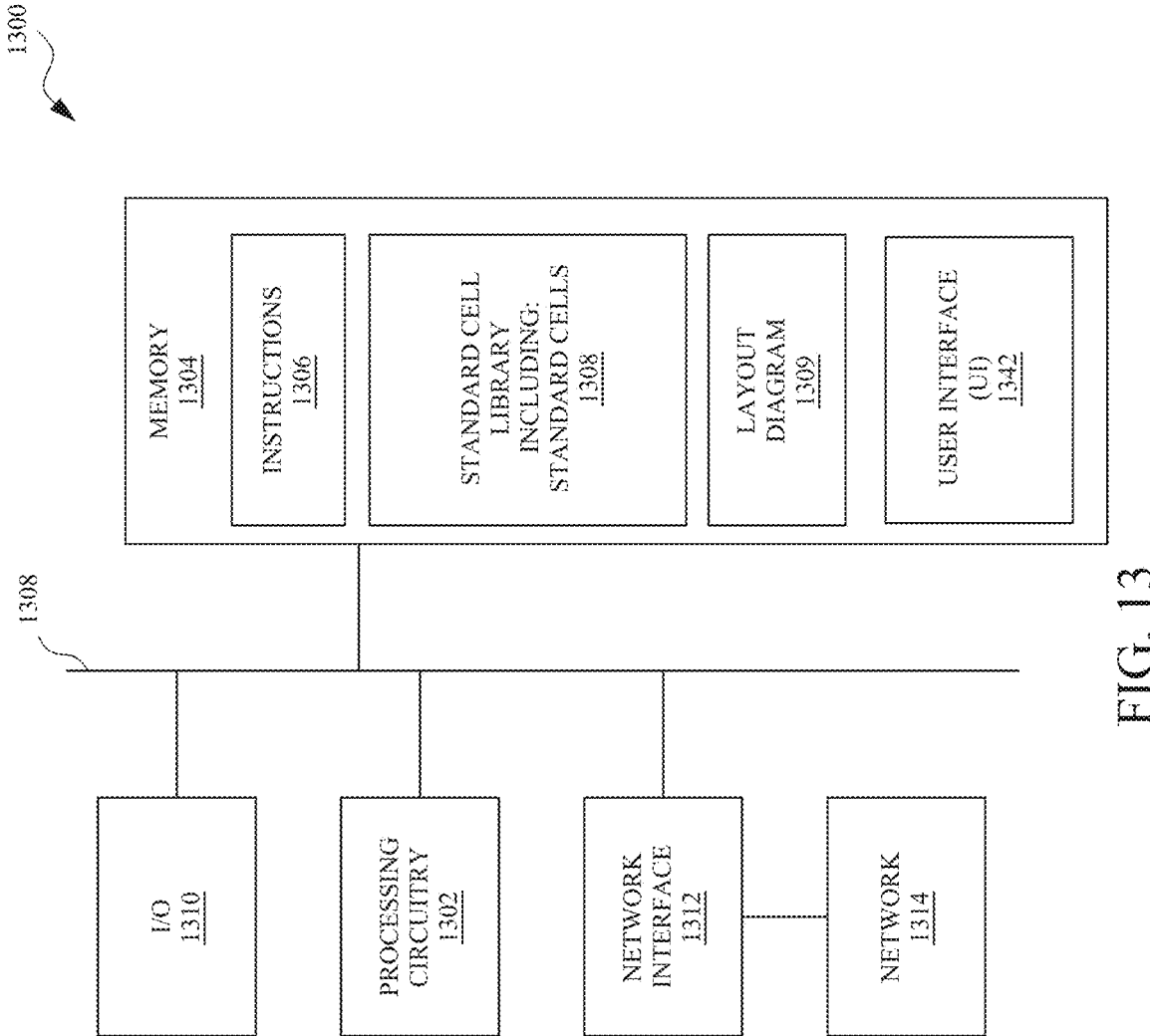
FIG. 13 is a block diagram of an electronic design automation (EDA) system in accordance with some embodiments.

In some embodiments, FIG. 13 is a block diagram of an electronic design automation (EDA) system 1300 in accordance with some embodiments. Additionally or alternatively, EDA system 1300 includes an APR system. In some embodiments, methods described herein of designing layout diagrams represent wire routing arrangements, in accordance with one or more embodiments, are implementable, for example, using EDA system 1300, in accordance with some embodiments.

In some embodiments, EDA system 1300 is a general purpose computing device including a hardware processor 1302 and a non-transitory, computer-readable storage medium 1304. Additionally or alternatively, storage medium 1304, amongst other things, is encoded with, i.e., stores, computer program code 1306, i.e., a set of executable instructions. In some embodiments, execution of computer program code 1306 by hardware processor 1302 represents (at least in part) an EDA tool which implements a portion or all of the methods described herein in accordance with one or more embodiments (hereinafter, the noted processes and/or methods).

In some embodiments, processor 1302 is electrically coupled to computer-readable storage medium 1304 via a bus 1308. Additionally or alternatively, processor 1302 is also electrically coupled to an I/O interface 1310 by bus 1308. In some embodiments, a network interface 1312 is also electrically connected to processor 1302 via bus 1308. Additionally or alternatively, network interface 1312 is connected to a network 1314, so that processor 1302 and computer-readable storage medium 1304 are capable of connecting to external elements via network 1314. In some embodiments, processor 1302 is configured to execute computer program code 1306 encoded in computer-readable storage medium 1304 in order to cause EDA system 1300 to be usable for performing a portion or all of the noted processes and/or methods. In one or more embodiments, processor 1302 is a central processing unit (CPU), a multi-processor, a distributed processing system, an application specific integrated circuit (ASIC), and/or a suitable processing unit.

In one or more embodiments, computer-readable storage medium 1304 is an electronic, magnetic, optical, electromagnetic, infrared, and/or a semiconductor system (or apparatus or device). For example, computer-readable storage medium 1304 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1304 includes a compact disk-read only memory (CD-ROM), a compact disk-read/write (CD-R/W), and/or a digital video disc (DVD).

In one or more embodiments, storage medium 1304 stores computer program code 1306 configured to cause EDA system 1300 (where such execution represents (at least in part) the EDA tool) to be usable for performing a portion or all of the noted processes and/or methods. In one or more embodiments, storage medium 1304 also stores information which facilitates performing a portion or all of the noted processes and/or methods. In one or more embodiments, storage medium 1304 stores library 1307 of standard cells including such standard cells as disclosed herein. In one or more embodiments, storage medium 1304 stores one or more layout diagrams 1309 corresponding to one or more layout diagrams disclosed herein.

In some embodiments, EDA system 1300 includes I/O interface 1310. Additionally or alternatively, I/O interface 1310 is coupled to external circuitry. In one or more embodiments, I/O interface 1310 includes a keyboard, keypad, mouse, trackball, trackpad, touchscreen, and/or cursor direction keys for communicating information and commands to processor 1302.

In some embodiments, EDA system 1300 also includes network interface 1312 coupled to processor 1302. Additionally or alternatively, network interface 1312 allows EDA system 1300 to communicate with network 1314, to which one or more other computer systems are connected. In some embodiments, network interface 1312 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EDA systems 1300.

In some embodiments, EDA system 1300 is configured to receive information through I/O interface 1310. Additionally or alternatively, the information received through I/O interface 1310 includes one or more of instructions, data, design rules, libraries of standard cells, and/or other parameters for processing by processor 1302. In some embodiments, the information is transferred to processor 1302 via bus 1308. Additionally or alternatively, EDA system 1300 is configured to receive information related to a UI through I/O interface 1310. In some embodiments, the information is stored in computer-readable medium 1304 as user interface (UI) 1342.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1300. In some embodiments, a layout diagram which includes standard cells is generated using a tool such as VIRTUOSO® available from CADENCE DESIGN SYS-TEMS, Inc., or another suitable layout diagram generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 14:
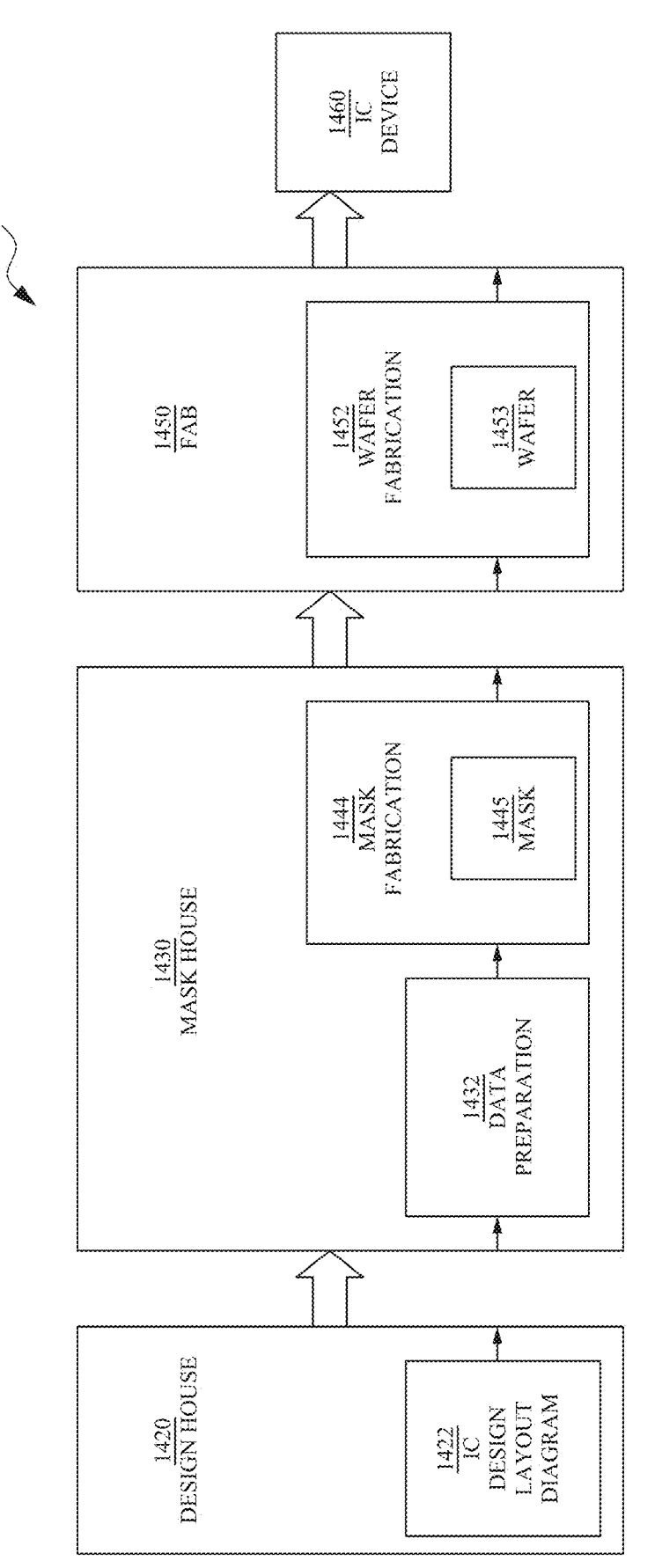
FIG. 14 is a block diagram of an integrated circuit (IC) manufacturing system, and an IC manufacturing flow associated therewith, in accordance with some embodiments.

FIG. 14 is a block diagram of an integrated circuit (IC) manufacturing system 1400, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1400.

In some embodiments, in FIG. 14, IC manufacturing system 1400 includes entities, such as a design house 1420, a mask house 1430, and an IC manufacturer/fabricator ("fab") 1450, that interact with one another in the design, development, and manufacturing cycles and/or services related to manufacturing an IC device 1460. Additionally or alternatively, the entities in system 1400 are connected by a communications network. In some embodiments, the communications network is a single network. In some embodiments, the communications network is a variety of different networks, such as an intranet and the Internet. Additionally or alternatively, the communications network includes wired and/or wireless communication channels. In some embodiments, each entity interacts with one or more of the other entities and provides services to and/or receives services from one or more of the other entities. In some embodiments, two or more of design house 1420, mask house 1430, and IC fab 1450 are owned by a single larger company. In some embodiments, two or more of design house 1420, mask house 1430, and IC fab 1450 coexist in a common facility and use common resources.

In some embodiments, design house (or design team) 1420 generates an IC design layout diagram 1422. Additionally or alternatively, IC design layout diagram 1422 includes various geometrical patterns designed for an IC device 1460. In some embodiments, the geometrical patterns correspond to patterns of metal, oxide, or semiconductor layers that make up the various components of IC device 1460 to be fabricated. Additionally or alternatively, the various layers combine to form various IC features. For example, a portion of IC design layout diagram 1422 includes various IC features, such as an active region, gate terminal, source terminal and drain terminal, metal lines or vias of an interlayer interconnection, and openings for bonding pads, to be formed in a semiconductor substrate (such as a silicon wafer) and various material layers disposed on the semiconductor substrate. In some embodiments, design house 1420 implements a proper design procedure to form IC design layout diagram 1422. Additionally or alternatively, the design procedure includes one or more of logic design, physical design or place and route. In some embodiments, IC design layout diagram 1422 is presented in one or more data files having information of the geometrical patterns. For example, IC design layout diagram 1422 is expressed in a GDSII file format or DFII file format.

In some embodiments, mask house 1430 includes mask data preparation 1432 and mask fabrication 1444. Additionally or alternatively, mask house 1430 uses IC design layout diagram 1422 to manufacture one or more masks 1445 to be used for fabricating the various layers of IC device 1460 according to IC design layout diagram 1422. In some embodiments, mask house 1430 performs mask data preparation 1432, where IC design layout diagram 1422 is translated into a representative data file ("RDF"). Additionally or alternatively, mask data preparation 1432 provides the RDF to mask fabrication 1444. In some embodiments, mask fabrication 1444 includes a mask writer. Additionally or alternatively, a mask writer converts the RDF to an image on a substrate, such as a mask (reticle) 1445 or a semiconductor wafer 1453. In some embodiments, the design layout diagram 1422 is manipulated by mask data preparation 1432 to comply with particular characteristics of the mask writer and/or requirements of IC fab 1450. Additionally or alternatively, in FIG. 14, mask data preparation 1432 and mask fabrication 1444 are illustrated as separate elements. In some embodiments, mask data preparation 1432 and mask fabrication 1444 are collectively referred to as mask data preparation.

In some embodiments, mask data preparation 1432 includes optical proximity correction (OPC) which uses lithography enhancement techniques to compensate for image errors, such as those that arise from diffraction, interference, other process effects and the like. Additionally or alternatively, OPC adjusts IC design layout diagram 1422. In some embodiments, mask data preparation 1432 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1432 includes a mask rule checker (MRC) that checks the IC design layout diagram 1422 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1422 to compensate for limitations during mask fabrication 1444, which undoes part of the modifications performed by OPC in order to meet mask creation rules.

In some embodiments, mask data preparation 1432 includes lithography process checking (LPC) that simulates processing that will be implemented by IC fab 1450 to fabricate IC device 1460. Additionally or alternatively, LPC simulates this processing based on IC design layout diagram 1422 to create a simulated manufactured device, such as IC device 1460. In some embodiments, the processing parameters in LPC simulation include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are repeated to further refine IC design layout diagram 1422.

In some embodiments, the above description of mask data preparation 1432 has been simplified for the purposes of clarity. In some embodiments, mask data preparation 1432 includes additional features such as a logic operation (LOP) to modify the IC design layout diagram 1422 according to manufacturing rules. Additionally, the processes applied to IC design layout diagram 1422 during mask data preparation 1432 are executed in a variety of different orders.

In some embodiments, after mask data preparation 1432 and during mask fabrication 1444, a mask 1445 or a group of masks 1445 are fabricated based on the modified IC design layout diagram 1422. In some embodiments, mask fabrication 1444 includes performing one or more lithographic exposures based on IC design layout diagram 1422. In some embodiments, an electron-beam (e-beam) or a mechanism of multiple e-beams is used to form a pattern on a mask (photomask or reticle) 1445 based on the modified IC design layout diagram 1422. Additionally or alternatively, mask 1445 is formed in various technologies. In some embodiments, mask 1445 is formed using binary technology. In some embodiments, a mask pattern includes opaque regions and transparent regions. Additionally or alternatively, a radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1445 includes a transparent substrate (e.g., fused quartz) and an opaque material (e.g., chromium) coated in the opaque regions of the binary mask. In another example, mask 1445 is formed using a phase shift technology. In a phase shift mask (PSM) version of mask 1445, various features in the pattern formed on the phase shift mask are configured to have proper phase difference to enhance the resolution and imaging quality. In various examples, the phase shift mask is attenuated PSM or alternating PSM. Additionally or alternatively, the mask(s) generated by mask fabrication 1444 is used in a variety of processes. For example, such a mask(s) is used in an ion implantation process to form various doped regions in semiconductor wafer 1453, in an etching process to form various etching regions in semiconductor wafer 1453, and/or in other suitable processes.

In some embodiments, IC fab 1450 is an IC fabrication business that includes one or more manufacturing facilities for the fabrication of a variety of different IC products. In some embodiments, IC fab 1450 is a semiconductor foundry. For example, there is a manufacturing facility for the front end fabrication of a plurality of IC products (front-end-of-line (FEOL) fabrication), while a second manufacturing facility provides the back end fabrication for the interconnection and packaging of the IC products (back-end-of-line (BEOL) fabrication), and a third manufacturing facility provides other services for the foundry business.

In some embodiments, IC fab 1450 includes fabrication tools 1452 configured to execute various manufacturing operations on semiconductor wafer 1453 such that IC device 1460 is fabricated in accordance with the mask(s), e.g., mask 1445. In various embodiments, fabrication tools 1452 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

In some embodiments, IC fab 1450 uses mask(s) 1445 fabricated by mask house 1430 to fabricate IC device 1460. Additionally or alternatively, IC fab 1450 at least indirectly uses IC design layout diagram 1422 to fabricate IC device 1460. In some embodiments, semiconductor wafer 1453 is fabricated by IC fab 1450 using mask(s) 1445 to form IC device 1460. In some embodiments, the IC fabrication includes performing one or more lithographic exposures based at least indirectly on IC design layout diagram 1422. In some embodiments, semiconductor wafer 1453 includes a silicon substrate or other proper substrate having material layers formed thereon. Additionally or alternatively, semiconductor wafer 1453 further includes one or more of various doped regions, dielectric features, multilevel interconnects, and the like (formed at subsequent manufacturing steps).

In some embodiments, details regarding an integrated circuit (IC) manufacturing system (e.g., system 1400 of FIG. 14), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 2066640838, published Feb. 6, 2014, and U.S. Pat. No. 7,260,442, granted Aug. 21, 2007, the entireties of each of which are hereby incorporated by reference.

In some embodiments, a semiconductor device includes: first and second input circuits in a central region and correspondingly configured to operate in a first voltage domain; first and second single bit level shifters (SBLSs) correspondingly in first and second regions at first and second sides of the central region relative to a first direction and electrically coupled correspondingly to the first and second input circuits, and correspondingly configured to operate in a second voltage domain; and a control circuit configured to toggle each of the first and second SBLSs between a normal state and a standby state when a control signal is received from the control circuit.

In some embodiments, relative to a reference line extending in a second direction perpendicular to the first direction and intersecting the central region, the first and second SBLSs are on opposite sides of the reference line.

In some embodiments, the first and second SBLSs are disposed substantially symmetrically with respect to the reference line.

In some embodiments, relative to a first reference line extending in the first direction and intersecting the central region, the first reference line intersects the first and second regions correspondingly in which are the first and second SBLSs.

In some embodiments, transistors that comprise the first SBLS are distributed asymmetrically on first and second sides of the first reference line; and transistors that comprise the second SBLS are distributed asymmetrically on the first and second sides of the first reference line.

In some embodiments, first and second counts of transistors of the first SBLS on the first and second sides of the first reference line are different; and third and fourth counts of transistors of the first SBLS on the first and second sides of the first reference line are different.

In some embodiments, the first count and the third count are same; and the second count and the fourth count are same.

In some embodiments, the first count is smaller than the second count; and the third count is smaller than the fourth count.

In some embodiments, relative to a second reference line extending in a second direction perpendicular to the first direction and intersecting the first reference line and the central region, the first and second input circuits are on opposite sides of the second reference line.

In some embodiments, transistors that comprise the first input circuit are asymmetrically distributed on first and second sides of the first reference line; and transistors that comprise the second input circuit are substantially asymmetrically distributed on the first and second sides of the first reference line.

In some embodiments, first and second counts of transistors correspondingly of the first and second input circuits are intersected by the first reference line; and third and fourth counts of transistors correspondingly of the first and second input circuits are free from being intersected by the first reference line and are on a same one of the first side or the second side the first reference line.

In some embodiments, a semiconductor device includes: first and second input circuits in a central region, on opposite sides of a first reference line. extending in a first direction and correspondingly configured to operate in a first voltage domain; first and second single bit level shifters (SBLSs) correspondingly in first and second regions at first and second sides of the central region relative to a second direction perpendicular to the first direction, and electrically coupled correspondingly to the first and second input circuits, and correspondingly configured to operate in a second voltage domain; and a control circuit configured to toggle each of the first and second SBLSs between a normal state and a standby state when a control signal is received from the control circuit.

In some embodiments, transistors that comprise the first input circuit are asymmetrically distributed on first and second sides of a second reference line perpendicular to the first reference line; and transistors that comprise the second input circuit are substantially asymmetrically distributed on the first and second sides of the second reference line.

In some embodiments, first and second counts of transistors correspondingly of the first and second input circuits are intersected by the second reference line; and third and fourth counts of transistors correspondingly of the first and second input circuits are free from being intersected by the second reference line and are all on the first side or the second side the second reference line.

In some embodiments, the first and second SBLSs are disposed substantially symmetrically with respect to the first reference line.

In some embodiments, a semiconductor device includes: first and second input circuits in a central region and correspondingly configured to operate in a first voltage domain; first and second single bit level shifters (SBLSs) correspondingly in first and second regions at first and second sides of the central region relative to a first direction and electrically coupled correspondingly to the first and second input circuits, and correspondingly configured to operate in a second voltage domain; relative to a first reference line extending in the first direction and intersecting the central region, the first reference line intersecting the first and second regions, transistors that comprise the first SBLS being distributed asymmetrically on first and second sides of the first reference line, and transistors that comprise the second SBLS are distributed asymmetrically on the first and second sides of the first reference line; and a control circuit configured to toggle each of the first and second SBLSs between a normal state and a standby state when a control signal is received from the control circuit.

In some embodiments, first and second counts of transistors of the first SBLS on the first and second sides of the first reference line are different; and third and fourth counts of transistors of the first SBLS on the first and second sides of the first reference line are different.

In some embodiments, the first count and the third count are same; and the second count and the fourth count are same.

In some embodiments, the first count is smaller than the second count; and the third count is smaller than the fourth count.

In some embodiments, relative to a second reference line extending in a second direction perpendicular to the first direction and intersecting the first reference line and the central region, the first and second input circuits are on opposite sides of the second reference line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
first and second input circuits in a central region and correspondingly configured to operate in a first voltage domain;
first and second single bit level shifters (SBLSs) correspondingly in first and second regions at first and second sides of the central region relative to a first direction and electrically coupled correspondingly to the first and second input circuits, and correspondingly configured to operate in a second voltage domain; and
a control circuit configured to toggle each of the first and second SBLSs between a normal state and a standby state when a control signal is received from the control circuit.

2. The semiconductor device of claim 1, wherein:
relative to a reference line extending in a second direction perpendicular to the first direction and intersecting the central region, the first and second SBLSs are on opposite sides of the reference line.

3. The semiconductor device of claim 2, wherein:
the first and second SBLSs are disposed substantially symmetrically with respect to the reference line.

4. The semiconductor device of claim 1, wherein:
relative to a first reference line extending in the first direction and intersecting the central region, the first reference line intersects the first and second regions correspondingly in which are the first and second SBLSs.

5. The semiconductor device of claim 4, wherein:
transistors included within the first SBLS are distributed asymmetrically on first and second sides of the first reference line; and
transistors included within the second SBLS are distributed asymmetrically on the first and second sides of the first reference line.

6. The semiconductor device of claim 5, wherein:

first and second counts of transistors of the first SBLS on the first and second sides of the first reference line are different; and third and fourth counts of transistors of the first SBLS on the first and second sides of the first reference line are different.

7. The semiconductor device of claim 6, wherein:

the first count and the third count are the same; and the second count and the fourth count are the same.

8. The semiconductor device of claim 6, wherein:

the first count is smaller than the second count; and the third count is smaller than the fourth count.

9. The semiconductor device of claim 4, wherein:

relative to a second reference line extending in a second direction perpendicular to the first direction and intersecting the first reference line and the central region, the first and second input circuits are on opposite sides of the second reference line.

10. The semiconductor device of claim 9, wherein:

transistors included within the first input circuit are asymmetrically distributed on first and second sides of the first reference line; and transistors included within the second input circuit are substantially asymmetrically distributed on the first and second sides of the first reference line.

11. The semiconductor device of claim 10, wherein:

first and second counts of transistors correspondingly of the first and second input circuits are intersected by the first reference line; and third and fourth counts of transistors correspondingly of the first and second input circuits are free from being intersected by the first reference line and are on the same one of the first side or the second side the first reference line.

12. A semiconductor device comprising:

first and second input circuits in a central region, on opposite sides of a first reference line, extending in a first direction and correspondingly configured to operate in a first voltage domain;

first and second single bit level shifters (SBLSs) correspondingly in first and second regions at first and second sides of the central region relative to a second direction perpendicular to the first direction, and electrically coupled correspondingly to the first and second input circuits, and correspondingly configured to operate in a second voltage domain; and a control circuit configured to toggle each of the first and second SBLSs between a normal state and a standby state when a control signal is received from the control circuit.

13. The semiconductor device of claim 12, wherein:

transistors included within the first input circuit are asymmetrically distributed on first and second sides of a second reference line perpendicular to the first reference line; and transistors included within the second input circuit are substantially asymmetrically distributed on the first and second sides of the second reference line.

14. The semiconductor device of claim 13, wherein:

first and second counts of transistors correspondingly of the first and second input circuits are intersected by the second reference line; and third and fourth counts of transistors correspondingly of the first and second input circuits are free from being intersected by the second reference line and are all on the first side or the second side the second reference line.

15. The semiconductor device of claim 12, wherein:

the first and second SBLSs are disposed substantially symmetrically with respect to the first reference line.

16. A semiconductor device comprising:

first and second input circuits in a central region and correspondingly configured to operate in a first voltage domain;

first and second single bit level shifters (SBLSs) correspondingly in first and second regions at first and second sides of the central region relative to a first direction and electrically coupled correspondingly to the first and second input circuits, and correspondingly configured to operate in a second voltage domain;

relative to a first reference line extending in the first direction and intersecting the central region, the first reference line intersecting the first and second regions, transistors included within the first SBLS being distributed asymmetrically on first and second sides of the first reference line, and transistors included within the second SBLS are distributed asymmetrically on the first and second sides of the first reference line; and a control circuit configured to toggle each of the first and second SBLSs between a normal state and a standby state when a control signal is received from the control circuit.

17. The semiconductor device of claim 16, wherein:

first and second counts of transistors of the first SBLS on the first and second sides of the first reference line are different; and third and fourth counts of transistors of the first SBLS on the first and second sides of the first reference line are different.

18. The semiconductor device of claim 17, wherein:

the first count and the third count are the same; and the second count and the fourth count are the same.

19. The semiconductor device of claim 17, wherein:

the first count is smaller than the second count; and the third count is smaller than the fourth count.

20. The semiconductor device of claim 16, wherein:

relative to a second reference line extending in a second direction perpendicular to the first direction and intersecting the first reference line and the central region, the first and second input circuits are on opposite sides of the second reference line.

* * * * *